United States Patent [19]
van Haagen et al.

[11] Patent Number: 5,889,270
[45] Date of Patent: Mar. 30, 1999

[54] BAR CODE DECODING USING MOVING AVERAGES TO BREAK THE (N.K.) CODE BARRIER FOR UPC, EAN, CODE 128 AND OTHERS

[75] Inventors: Ernst van Haagen; Leonard Storch; Leonard Frank, all of New York, N.Y.

[73] Assignee: CIAS, Inc., New York, N.Y.

[21] Appl. No.: 833,378

[22] Filed: Apr. 7, 1997

Related U.S. Application Data

[60] Division of Ser. No. 303,512, Sep. 9, 1994, Pat. No. 5,675, 137, and a continuation-in-part of Ser. No. 225,731, Apr. 11, 1994, Pat. No. 5,548,110, and a continuation-in-part of Ser. No. 919,502, Jul. 24, 1992, abandoned.

[51] Int. Cl.[6] .................................................. G06K 7/10
[52] U.S. Cl. ........................................ 235/462; 235/436
[58] Field of Search ..................................... 235/462, 436, 235/472, 432, 440, 466; 250/566, 568, 570, 571

*Primary Examiner*—Thien Minh Le
*Attorney, Agent, or Firm*—Cowan, Liebowitz & Latman, P.C.

[57] ABSTRACT

The new generic bar code decoder system described, with its multistage error correcting, is far more powerful than dedicated reference decode algorithms for popular linear and two dimensional bar codes. For example: the 1-7 and 2-8 EAN and UPC character substitution problems are 100% solved (because EAN and UPC become 100% self-checking with the new decoder); the ink spread tolerance improves, especially for EAN, UPC, Code 128 and Code 16K; far greater levels of random systematic edge noise are tolerated and decoded; even many spike edge errors greater than 0.50X module can be corrected; and, generous levels of acceleration are tolerated. These are all the ways bar code scanning data gets distorted. Using this new generic decoder system, the ultimate linear binary coded binary bar code with error correcting, BCB, also described, performs dramatically better than any other, despite being more compact. Computer simulation testing of the generic bar code decoder has already been conducted on BCB and UPC timing count scan data records that were distorted with various levels of ink spread, noise, spikes and acceleration using new bar code testbench software, all of which is also described including test results, to show the advances that have been made in bar code science.

22 Claims, 9 Drawing Sheets

Two BCB characters:

Two BCB end patterns:

... information ...

BAR CODE DECODING USING MOVING AVERAGES TO BREAK THE (N.K.) CODE BARRIER FOR UPC, EAN, CODE 128 AND OTHERS

This application is a division of application Ser. No. 08/303,512, filed Sep. 9, 1994, now U.S. Pat. No. 5,675,137 and a continuation-in-part of applications Ser. No. 08/225,731, filed Apr. 11, 1994 now U.S. Pat. No. 5,548,110 and Ser. No. 07/919,502 filed Jul. 24, 1992 now abandoned, both titled, "OPTIMAL, ERROR-DETECTING, ERROR-CORRECTING AND OTHER CODING AND PROCESSING, PARTICULARLY FOR BAR CODES, AND APPLICATIONS THEREFOR SUCH AS COUNTERFEIT DETECTION." Application Ser. No. 08/225,731 is a division of application Ser. No. 07/919,502, which is a continuation of application Ser. No. 07/420,101 filed Oct. 11, 1989, now abandoned. Application Ser. No. 07/420,101 is a continuation-in-part of application Ser. No. 07/292,569 filed Dec. 30, 1988, now abandoned, which is a continuation of application Ser. No. 06/853,745 filed Apr. 18, 1986, now U.S. Pat. No. 4,814,589. The disclosures of all of the above applications and patents are incorporated herein by reference.

BACKGROUND OF THE INVENTION

Described in prior patent applications cited above of two of the applicants herein, Leonard Storch and Ernst van Haagen, is a new and improved bar code structure called binary coded binary, BCB. BCB cannot realize its performance potential when decoded by common present day bar code decoding processes, methods and devices such as the type of reference decode algorithm systems published and described in AIM's (AIM Incorporated is an industry trade association based in Pittsburgh, Pa., Automatic Identification Manufacturers) Uniform Symbology Specifications (USS), ©1993 (copies filed herewith) and elsewhere.

What has now been invented by the applicants are new bar code decode processes, methods and devices that incorporate, for example, a moving average, and begin to realize BCB's decode performance potential, including, for example: improved ability to handle extreme levels of ink spread and ink shrink distortion, the limit becomes the point where the sensing apparatus cannot resolve narrow bar code elements; and, improved ability to handle apparent and actual random edge dislocation distortion (systematic, every edge affected), referred to by applicants as edge noise; as well as improved ability to handle apparent and actual occasional greater-amplitude random edge dislocation distortion (non-systematic, occasional edges affected), referred to by applicants as edge spikes.

As it turns out, applicants' new bar code decode processes, methods and devices invented and disclosed in this present application for BCB, can also be used to decode other linear bar codes, including, by way of example, UPC, Code 128 and Code 93; UPC, Code 128 and Code 93 symbols can be decoded exactly as they are now printed. Codabar, Code 39 and Interleaved 2-of-5 can also be decoded by applicants' new decoder if they are printed using whole multiples of modules and no fractional ratios for narrow and wide elements, for example, ratios of 2:1 exactly or 3:1 exactly can be made to work with applicants' new decoder. (A module is defined by AIM as: "The narrowest nominal width unit of measure in a symbol. One or more modules are used to construct an element.") Codabar and Code 39 are discrete (not continuous) and therefore have intercharacter gaps; the intercharacter gaps must also be printed using whole multiples of modules if applicants' new decoder is to decode them with maximum accuracy.

One benefit using applicants' new decoder inventions for UPC, for example, is that the well-known 1-7 and 2-8 UPC character substitution problems can be avoided altogether (this has been a much sought after holy grail for serious bar code enthusiasts). Applicants' present inventions may be used for these and other popular (linear) bar codes, as well as for various two dimensional (2D) bar codes, such as Code 16K, Code 49, PDF 417 and others, in order to increase reading system accuracy and output productivity when high levels of ink spread, edge noise and other distortions are present. (Bar code elements in a linear bar code are disposed along one line, and in a 2D bar code the elements are disposed along two or more lines.)

Applicants also disclose novel means to precisely distort pristine bar code symbol timing count data, and means to simulate bar code decoding on computer apparatus. This, for the first time, allows controlled meaningful comparisons between different decoding processes and methods as well as between different bar code symbologies. The bar code industry was estimated in 1992 to be over $5 billion, and growing toward $20 billion by the turn of the century, yet, as of this patent filing, mean time between bar code failure data and related data is nonexistent, and worse, empirical data gleaned from various elaborate bar code reading tests conducted during the last decade is misleading. Applicants' distortion and simulation apparatus, processes and methods will allow such valuable data to become an integral part of this booming new automatic identification industry.

(n, k) Bar Code Decoding

Versus

Moving Average Decoding

While the number of bar code modules from one serial number to the next in BCB format B symbols, for example, is constant as it is in other symbologies, the number and combination of 1X and 2X bar code elements, which are BCB's only legal elements widths, within a BCB symbol may vary from one extreme to the other from one symbol to the next depending on the particular serial number being represented. This is not the same as typical character based bar codes of the fixed (n, k) type, for example, Code 93, Code 128, UPC and Code 16K. These (n, k) bar codes are defined by the use of codewords, distinctive patterns of k bars and spaces, each pattern having n modules, to represent respective characters of the set of characters codable in respective symbologies. Code 39, Codabar and Interleaved 2-of-5 (I 2/5), for example, are closely related to (n, k) bar codes.

One value (n, k) and related types of codes bring to character based bar code symbologies is a convenient group therapy decoding shortcut technique to calculate the average number of timing counts per module, Z, for each character pattern of k bars and spaces. Z is a term AIM defined as: "((average narrow bar)+(average narrow space))/2." In actual practice, an accurate Z cannot be calculated from two narrow elements. The term Z is used below meaning the average timing counts per module; Z may also be called the local average, the local or reference distance. How Z is calculated strikes to the very heart of decoding and is fundamental to respective bar code symbologies and to methods, processes and devices for decoding them.

The convenient calculation for Z in (n, k) and related codes is made by dividing the total number of timing counts (as measured by the reading apparatus for each character) for a codeword, for example, as defined by k bars and spaces, by n because n is, by symbology conventions, a given (see, for example, AIM's Uniform Symbology Specifications, Section 4 for Code 128, Code 93 and Code 16K). This describes the (fixed) "pitch" of a bar code. Because (n, k) codewords have a (fixed) pitch, applicants characterize such codes as directly character by character self-clocking.

BCB is short on such fixed pitch (but long on rhythm, however, since BCB is based on the first harmonic of binary). While BCB is not directly self-clocking on a character by character basis as is typical of (n, k) codes, BCB is more than sufficiently indirectly self-clocking because of applicants' new decoding methods, processes and devices: BCB's varying element by element pitch is not only determinable just in time and just as required for decoding, but it is more abundantly determinable in more ways than typical (n, k) codes as described below, as a result of applicants' self-decoded-clocking innovations.

The only legal element widths in BCB are 1X and 2X. BCB uses only two binary data characters which are not necessarily defined by edges; a 2X element in BCB spans two BCB binary data characters. In BCB, n cannot be a given in relation to k as it is in other symbologies. However, BCB is related to (n, k) codes. For example, BCB may be thought of as a variable (n, k) bar code, the bar code that broke the (n, k) decode barrier, or BCB may be thought of as the ultimate (n, k) bar code because the data elements of each BCB symbol form one big (n, k) codeword.

Like other symbologies, n is a given in BCB's start and stop patterns, however. BCB's start and stop end patterns are directly self-clocking in the typical sense: The average number of timing counts per module, Z, is first calculated in BCB using a known n from a given (fixed) BCB start pattern or stop pattern convention, fixed codewords, where the number of bars and spaces is also known, and thereafter the number of modules per individual element is decoded one element at a time, continuously, from one end of the symbol to the other, element by element.

In one decoding embodiment, a selected minimum number of modules is divided into one or more associated pairs of elements, the fewest number of pairs of elements needed to realize the selected minimum number of modules, according to a selected decoding convention, in order to calculate Z, in a directional moving average process. A new calculation for Z is made for each line using a moving average, in contrast to the typical static, or fixed, (n, k) character by character based group average decoding technique—moving average versus character by character.

Or, instead of using a selectable subtotal of some minimum number of modules to calculate Z, in another embodiment a selected constant number of pairs of elements is used in order to calculate Z, also in a directional moving average process. For example, if a constant number of two pairs of elements were selected: As the number of modules is decoded continuously element by element, the total number of modules comprising the last two pairs of decoded elements is divided into the timing count total for these last two pairs of elements in order to calculate Z, in a directional moving average process; a fresh calculation for Z is made for each line in turn as described.

In either embodiment, 1) a selected minimum number of modules or 2) a selected constant number of pairs of elements, the average number of timing counts per module, Z, may thus be calculated for each edge of the data elements. These two selectable variables are two reasons for characterizing BCB as a variable (n, k) bar code, and further characterizing applicants' new decoder as a variable (n, k) decoder able to decode any (n, k) bar code (printed using integer width elements). Moreover, for a given n, k may vary from one extreme to the other from one BCB symbol to the next. From another viewpoint, a BCB symbol may be thought of a large (n, k) codeword where k=n/2(2X elements must be counted twice).

According to applicants' invention, a more accurate Z for calculations may be had using applicants' various "multi-edge" reference techniques which involve different types of averages, including, for example, the arithmetic mean and the median, as well as other averaging possibilities for their multi-edge approach, such as the mode, the geometric mean and the quadratic mean. For example, by selected decoding convention, on each line during decoding, the median of a selected number of prior calculated Z's may be selected for use as the operational Z, a more accurate reference yardstick distance, or local average, with which to measure a sample distance. This is described in detail below.

However Z is derived, Z is then used to characterize, or otherwise determine, by one means or another, in terms of an integer (whole number) module value, the next overlapping pair of elements. AIM's USSs refer to such characterizing as, converting edge to edge measurements of pairs of elements to "normalized" values. In any case, this value represents the distance or length of said pair in whole modules. Said next overlapping pair of elements is comprised of a known element and an unknown element, i.e., the last (decoded and known) element of the last pair of elements used for the last calculation of Z, and the next element which has not yet been decoded and is therefore unknown. This said next pair of elements comprised of the last decoded known element and the next unknown element is in turn characterized in terms of an integer module value using the next Z as a reference.

For example, say Z has been determined to be 100 timing counts, and the pair of elements in question measures 315 timing counts. Therefore: 315/100=3.15. The fraction portion 0.15 is dropped (more about the fraction portion below); a characterization of a pair of elements is the rounded integer result of dividing a pair of elements to be characterized by Z. In this example therefore, the pair of elements is characterized as 3 modules.

Then, the unknown element of this pair is decoded as follows: the decoded known element module value 2 is subtracted from the module value 3 characterized for said next pair of overlapping elements; what remains is the integer module value of the unknown element, 1, in this example. Now, knowing the integer module value of said next unknown element, this process can be repeated on the next immediately following overlapping pair of elements comprised of the most recently decoded and known element value (1 in this example) and the next unknown element, and repeated again, and repeated over and over until all unknown elements have been thus decoded.

Because of this new directional moving process which decodes n repeatedly so that the average number of timing counts per module may be continuously calculated, there is little or no tradeoff loss in this context by not being a typical (n, k) character based bar code and having a known (fixed) n for each character as described. The benefits of BCB and of applicants' new bar code decoder inventions, however, are numerous and these various benefits are described in technical detail in context below, and are partially summarized now in abstract fashion:

In a valid BCB symbol, between BCB's ending patterns, there are an equal number of white to black modules arranged so that, at any point and from either direction, the number of modules of one color does not exceed the other by more than one, the lowest limit possible in order to express notation with place value when using two colors. Remarkably, for example, all legal 2X data elements in BCB must begin on an odd numbered module, and therefore any 2X element that begins on an even numbered module must be illegal. One feature of BCB is perfect black and white balance, one result of being the first harmonic of binary and why each BCB symbol forms one big (n, k) codeword.

In this context, there is a tradeoff loss for the decoding shortcut convenience used in other bar codes, however. In typical Edge-to-Edge symbologies (edge-to-edge always means edge-to-similar-edge), for example, Code 128, UPC and Code 93, you do not know how many of the n modules are supposed to be black or white in a scanned character pattern. In typical Two-Width symbologies, for example, Code 39, I 2/5 and Codabar, you do not know how many of the n modules are supposed to be black or white up to any given edge within a scanned character pattern. Others are not as balanced as BCB.

AIM's 1993 Uniform Symbology Specifications describe the two categories of linear symbologies mentioned above, Edge-to-Edge and Two-Width, and these two terms refer to the particular strength of their respective codes: Edge-to-edge refers a particular strength that makes them less sensitive to uniform ink spread or shrink, and two-width refers to a particular strength that makes them robust and easy to decode.

BCB fits into both of these categories and represents a compounded improvement which stems from the unique combination of these two strengths: BCB uses only two widths of elements, but at a uniform and perfect harmonic ratio of 2:1 exactly; and BCB is continuously decodable purely edge-to-edge, every edge-to-edge measurement is utilized in turn in a continuous fashion; ink spread considerations simply do not get involved in the decoding process.

The combination of edge-to-edge power in a perfectly balanced two-width structure has given BCB additional strengths which are not currently found in others and includes means of inherent decode self-correcting which is a many fold improvement beyond the mere self-checking many other bar codes presently offer. Self-correcting and other enhanced decode features are described below for use with BCB and other bar codes in less abstract terms with concrete examples.

OBJECTS AND SUMMARY OF THE INVENTION

It is an object of the invention to provide improved methods, apparatus, devices and systems for machine reading and decoding bar codes.

It is another object of the invention to provide bar code decoding that is generic to most of the linear and two dimensional bar code symbologies in current use, including, UPC, EAN, Code 128, Code 93, Code 16K, Code 49, and, if printed at even (no fraction) wide-to-narrow width ratios, Code 39, Interleaved 2 of 5 and Codabar.

It is another object of the invention to provide such bar code decoding with multistage error correcting.

It is another object of the invention to provide bar code decoder systems, methods, and devices which tolerate increased levels of ink spread, random systematic edge noise, occasional spike edge errors (fliers) and generous levels of acceleration.

It is another object of the invention to provide new computer simulation bar code testbench software which has simulated test runs using the new bar code decoding described in the above objects on BCB and UPC timing count scan data records that were distorted with various levels of ink spread, noise, spikes and acceleration using this testbench software.

The present invention provides methods, apparatus and systems of decoding a bar coded representation of characters, which includes a plurality of bar elements separated by space elements of detectably different characteristics, and in which the bar and space elements have one or more different module widths and are separated by edges defining transitions between adjacent elements.

In one embodiment, the distances between adjacent leading edges of the bars comprising the bar coded representation of characters, which define a pair of elements therebetween including a bar element and a space element, respectively, are measured; the distances between adjacent trailing edges of the bars comprising the bar coded representation of characters, which define a pair of elements therebetween including a space element and a bar element, respectively, are measured; reference distances covering at least one pair of adjacent elements included in the bar coded representation of characters are measured; the distances defining pairs of elements with respect to the reference distances are categorized; and the bar coded representation of characters is identified from the categorizations whereby the bar coded representation of characters is decoded.

In this embodiment further, the categorizations may be first separated into sequences of individual bar and space elements and then the bar coded representation of characters may be identified from these separated individual element sequences, instead of being identified directly from the categorizations. A sequence of reference distances may be established in which reference distances overlap. A constant number of pairs of elements may be used to establish each individual reference distance. A constant number of pairs of elements may be used to establish the reference distances, and this number may be automatically selected, or, the number of pairs of elements used to establish the reference distances may be selected so that the fewest number of pairs of elements are used to satisfy a selected minimum number of modules which are used to establish individual reference distances.

More than two edges may be used to establish reference distances which are used to categorize other distances, the sample distances which defined by one pair of elements between two adjacent similar edges, either two similar leading edges or two similar trailing edges. Each of these more than two edges may only be used once. An average, for example, an arithmetic mean or a median, of two or more reference distances may be used to establish reference distances that are used to categorize distances between adjacent similar edges, and these average reference distances may be automatically selected while decoding from two or more reference distances. Established reference distances that are used to categorize distances between adjacent similar edges may be dampened by a selected amount so that how much they can change from one categorization to the next categorization is limited to the selected amount or less.

In one embodiment, at least one element is known, typically because each bar code symbology has distinctive fixed end patterns and they are recognized and identified by their respective fixed end patterns. Once identified, the module widths of the elements in fixed patterns become known because respective symbology conventions assign module widths to each element of their end patterns. Typically, the module widths of several symbologies' end patterns are recorded in auto-discriminating bar code decoders so that several symbologies can be recognized. Thus, the module widths of known elements need not be decoded.

In this one embodiment, at least one distance between adjacent edges defining a pair of elements therebetween that includes one known element is measured, and at least one distance between adjacent edges defining a pair of elements overlapping this at least one distance between adjacent edges defining a pair of elements therebetween that includes one known element is also measured.

In another embodiment, at least two categorized pairs of elements are separated into respective individual elements, and the at least two of the separated individual elements comprise at least in part one bar coded representation of a character. The one bar coded representation of a character is identified from the categorized distances between adjacent edges defining pairs of elements and the at least two of the separated individual elements whereby the one bar coded representation of a character may be decoded.

In yet another embodiment, the characters are coded according to bar code convention with logic structure, and possible categorizing errors are avoided based on the logic structure of the bar code convention.

In another embodiment, one or more of the edges are mislocated more than other edges. In this case, the accuracy of categorizing the distances between adjacent edges defining pairs of elements is increased based on subtracting the timing counts from an element on one side of a mislocated edge and adding timing counts to the element on the other side of the mislocated edge.

In another embodiment, the processing direction of the bar coded representation of characters is reversed and the bar coded representation of characters is processed a second time in the reversed direction. The bar coded representation of characters may be identified and decoded from the categorizations from one or both directions of processing.

In yet an other embodiment, a second processing with different steps or processing parameters is performed on the same scan data record to obtain another useful result. This is called "software voting."

In another embodiment, a system is provided including means for distorting the edges of bar code timing count scan data to simulate different bar code edge distortions. This means distorts the edges in stages with ink spread, noise and acceleration in selectable levels for each distortion, and includes means to test the distorted bar code timing count scan data and means to print-out test results.

BRIEF DESCRIPTION OF THE DRAWINGS

The invention is illustrated by way of example and not limitation in the figures of the accompanying drawings in which like references indicate like parts, and in which.

BRIEF DESCRIPTION OF THE APPENDICES

Appendix A contains spreadsheet printouts showing the new bar code decoder at work on 21 UPC misreads reported by AIM.

Appendix B contains spreadsheet printouts showing the new bar code decoder process at work on BCB no-reads described in association with Tables 9 & 10.

Appendix C includes instructions to program features of the new bar code decoder.

Appendix D describes a comprehensive computerized bar code testbench system, a milestone in the evolution of bar code science.

BRIEF DESCRIPTION OF THE CONTENTS

Bar Code Decoding
   using moving averages to break the (n, k) code barrier for UPC,
   EAN, Code 128 and Others 1
Background of the Invention 2
(n, k) Bar Code Decoding versus Moving Average Decoding 3
Objects and Summary of the Invention 6
Brief Description of the Drawings 9
Brief Description of the Appendices 10
Brief Description of the Contents
   (you are here now) 11
Binary Coded Binary, BCB 12
End Patterns 12
Numbering Machine Octal Format 13
Format Change Code 13
Midpoint Pattern 14
8 Standard BCB™ Formats Chart 15
Character Placement Specifications 16
BCB Decode Algorithm System 19
Leading Zeros 20
Identifying and Interpreting Bar Code
   Characters by Pairs of Elements or by Individual Elements 21
UPC Character Ambiguities 25
Decode Rounding Decisions 28
Straddling 30
Sample UPC Decoding 31
Directional Decoding with Four Edges 33
Reverse Processing to Double Output 34
Software Voting 35
The Damper 35
Detecting Errors 37
Cooking, Individual Edge Corrections 38
BCB Fractional Logic 43
BCB Integer Logic 44
Computer Bar Code Simulations 46
Custom Cooking Recipes 49
More Edges Are Better Than Two to Figure Z 51

The Six Edge Approach to Figure Z 51
The Independent Median Approach to Figure Z 54
BCB Identification Logic 57
Computer System 57
Modifications & Other Embodiments 58
Claims 59
Abstract 66
AIM's UPC Misreads Appendix A
BCB Test Spreadsheets Appendix B
Decoder Program Appendix C
Bar Code Testbench Appendix D

DETAILED DESCRIPTION

Binary Coded Binary, BCB

Figure 1:
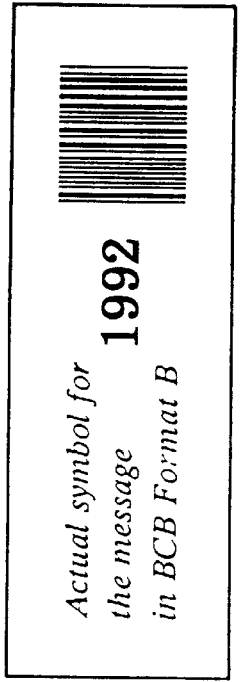
FIG. 1 represents and shows a BCB Format B bar code symbol for numerical information in binary arithmetic.
Figure 1:
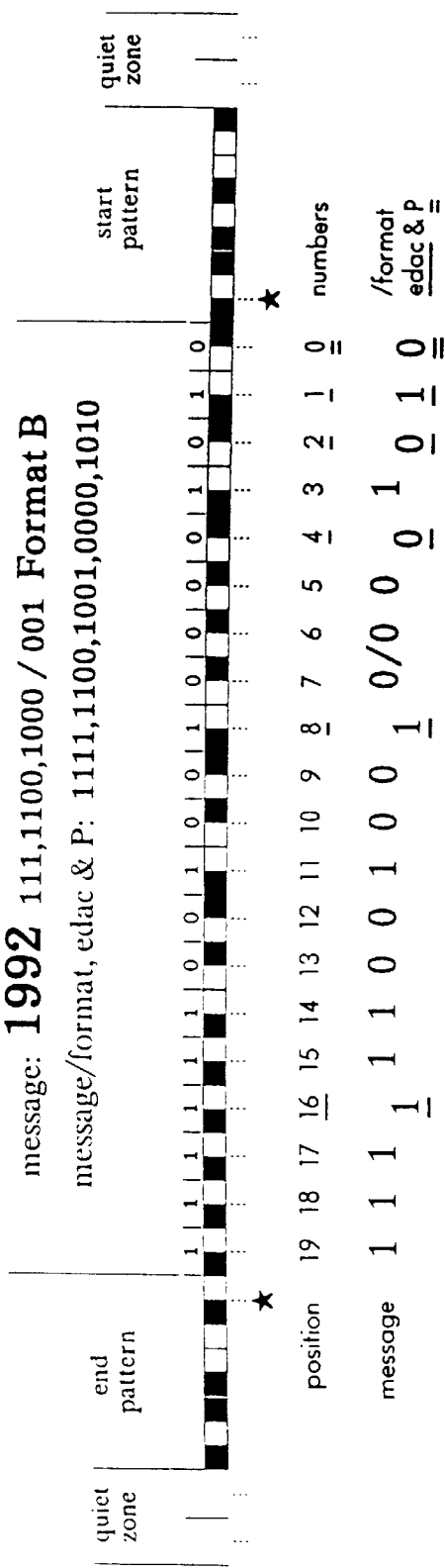

FIG. 1 shows and illustrates a BCB Format B symbol which represents numerical coded information in binary arithmetic using two (data) characters as described in prior applications cited above. The following is presented by way of summary and by way of current disclosure.

Figure 2A:
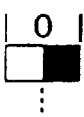
FIGS. 2A and 2B represent the two BCB data characters and two BCB end patterns.
Figure 2A:
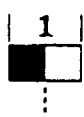
Figure 2B:
Figure 2B:

BCB's two characters are shown separately in FIGS. 2A and 2B. A BCB zero digit, 0, is represented by a two module pattern, one white module followed by one black module pattern. A BCB one digit, 1, is represented by a two module pattern, one black module followed by one white module. As seen in context in FIG. 1, a 2X element in BCB spans two BCB digits: 2X white elements span BCB 1,0 digit combinations, and 2X black elements span BCB 0,1 digit combinations.

Two standard format BCB end patterns are shown in FIGS. 2A and 2B. These BCB ending patterns incorporate these desirable features: The outside bar (adjacent the blank quiet zone, qz) is a sacrificial "bloom" bar, the measurement of which can be ignored. The reading direction is independently determinable from both bars and spaces while within respective ending pattern. Both a white,white and a black, black BCB digit position are found in each pattern, so that neither ending pattern can be confused with possible information. The exact beginning of the information may be determined before the scan leaves the particular ending pattern (first) encountered. A minimum number of modules is used to have all these desirable features. These BCB ending pattern were designed as follows:

Given the nature of bar code reading devices, typically, the leading edge of first bar encountered (from the quiet zone) is not accurately measured. Since this first bar syndrome, or bloom, is a phenomenon that must be addressed, and since a general purpose bar code may be scanned from both directions, both ending patterns begin with (adjacent the quiet zone) a sacrificial bloom (black) bar (no need to use more than one module).

Following this first one module bloom bar will be a white (white must follow black, and vice versa) module and following the other one module bloom bar will be two (white,white) modules; this so that the white spaces can offer directionality in both end patterns.

This white and this white,white must be followed by at least one black. So far we have the following fixed patterns, no choice, shown in one direction (e.g., forward) on one line and the other direction (e.g., reverse) on the next line so that the differences between the stop and start patterns may be easily compared, where one black module=1 and one white module=0:

1001 . . . information . . . 101
101 . . . information . . . 1001
Then these two continuations are possible:

(a)

100110101 . . . information . . . 101100101
101001101 . . . information . . . 101011001 or (b)

100101101 . . . information . . . 01001101
10110010 . . . information . . . 101101001

Because (a) may interfere with BCB's change format pattern and midpoint pattern, which are described below, and uses one more module, (b) is the choice for standard formats, given specified parameters, i.e., all the desirable features previously mentioned. (a) is reserved for use with numbering machines. Other considerations include possible conflict with other bar codes' patterns; for example, (only) one new pattern is similar to the asterisk start/stop character in Code 39.

By using the (a) start and stop ending patterns shown as the "numbering machine format" end patterns, BCB symbols may be printed by consecutive numbering machine devices, such as those made by Atlantic Zeiser of New Jersey, and be thus distinguishable from BCB standard format symbols. This works out well because a BCB change format pattern and midpoint pattern are not contemplated for use with the numbering machine format. When used in the numbering machine format, BCB is assembled into octal and eight octal characters, each comprised of three BCB digits, are placed on eight respective surfaces of an individual numbering machine wheel. BCB's edac and BCB format digits (if used), are clustered onto one or two motor driven wheels at one or both ends of the symbol. The motor(s) are controlled by a computer according to adopted BCB format and or edac convention.

BCB standard format start and stop code patterns are illustration in binary for explanation below:

qz 10110010 . . . information/format . . . 101101001 qz

BCB Standard Formats A, B and D may include a "format change code," fcc, pattern within a symbol in order to change from one of these three formats to either of the other two formats.

BCB has the ability to change among these three basic formats within a symbol as follows: From Format A to B or D, from B to A or D, and from D to A or B. The fcc pattern shown below in binary illustration would be located somewhere between the stop pattern and the format digit positions which are located near the start code. The format indicated in these format digit positions is the "starting format." The fcc has formatted information immediately to both sides of it—to the side toward the start code, information coded in the starting format, and to the other side information coded in one of the other two formats, in accord with the following standard BCB format convention for a format change:

If the starting format is Format A, change to B; if the starting format is Format B, change to A; if the starting format is Format D, change to A:

Format change code qz 10110010 . . . information . . . 0101001101 . . . information/format . . . 101101001 qz If the starting format is Format A, change to D; if the starting format is Format B, change to D; if the starting format is Format D, change to B:

Format change code qz 10110010 . . . information . . . 1001001101 . . . information/format . . . 101101001 qz Conflict between the format change code pattern, 0101001101 or 1001001101, and an edac position is possible; if an edac position would occur to the left of the 00, or between the 00 11, or to the right of the 11 in a fcc pattern (illustrated where the three colons appear, respectively, 0101:00:11:01 or 1001:00:11:01), that represents a conflict. For example, two 3X elements may result, it is and undesirable and a conflict in BCB to use 3X elements.

Conflicts can be avoided be arranging the data in the coded message to avoid the conflict, for example, BCB zero digits can be added between the message portion and the fcc so that the edac digit occurs before (in a lower position number than) the fcc positions. Or, by adopted convention, any edac digit that may conflict with the fcc as described may be inserted after the conflicting positions, for example, the edac digit may be put by convention into the position illustrated in the fcc by the semicolon, 01;01001101 or 10;01001101.

As described below, illegal 2X elements in BCB are detected because they begin on an even numbered module. The 0011 portion of the fcc pattern will therefore be detected as two illegal 2X elements because they begin on an even numbered module. In an application using fcc patterns, care should be taken not to count an otherwise proper 0011 portion in a format change code pattern as two detected but uncorrected errors (described below).

BCB Midpoint Pattern

Not too many in the business have good things to say about the UPC bar code. UPC has very tight printing requirements which necessitate high resolution imaging devices and other costly accommodations. It seems UPC is the only code that fails tests like those run by AIM for the HIBCC at Ohio University. Everyone remembers the clerks' frustration in supermarkets when every other product or so was waved back and forth repeatedly over the scanner to get a reading.

Be that as it may, UPC's fixed structure incorporates a unique strength: it has a symmetrical center reference pattern which allows each half of the symbol to be read separately. With UPC's symmetrical center reference pattern, and its parity scheme of odd left half characters and even right half characters, each half of the UPC symbol enjoys the benefit of start and stop and directional references for decoding.

BCB may also use a center pattern. For example, in dedicated environments, particularly when fixed lengths of information are required, a custom BCB convention may be adopted to provide an (improved) polarized center reference point illustrated in binary which will provide for greater bar code symbol capture-ability similar to UPC and improve data reconstruction or stitching performance:

```
            stop                    Midpoint Pattern
qz 10110010 ... information ... 10110010 ... information/
                                                    start
                                     format ... 101101001 qz
```

Using only 8 modules that work double duty, BCB's midpoint pattern works as a stop pattern with BCB's start pattern, while also working as a start pattern with BCB's stop pattern. Unlike UPC's symmetrical pattern, BCB's center pattern is polarized, and thus conveys directionality. Each half of the BCB symbol benefits from both start and stop references; each of these three references, the stop point, double duty mid point and starting point, informs of scanning direction independently.

A midpoint is also valuable when scans traverse the middle of the symbol but fail to encounter either end pattern. BCB's midpoint feature almost doubles the range of effective scan angles by salvaging fully referenced half-symbol scan data that maybe assembled into a full scan data set from much steeper scanning angles, thus requiring far fewer scans to confidently capture a reading from a BCB symbol on an object, especially when it is moving on a conveyer, for example.

BCB Versatility

The message coded in the example shown in FIG. 1 is: 1992. Between the end patterns are 20 BCB digits in position numbers 0 (on the right) to 19 (on the left) as shown. The single underlines show the positions that contain BCB edac (error detection and correction) digits, described below. The double underline, position 0, contains the BCB symbol parity digit. Edac and parity are also shown lower than the message/format digits on the bottom line of FIG. 1, which shows the complete sequence of BCB digits. The upper remaining shown-aligned positions contain the binary message/format digits. BCB is extremely versatile. For example, eight proposed BCB formats are listed and described in the following:

Standard BCB™ Formats Chart

| Format | Standard BCB Format Descriptions |
|---|---|
| A: 000 | Emulation of Code 39 USD-3's set of 44 alphanumeric characters. The BCB digit position following the three format digits, if on (1), indicates that "data identifiers" as specified by FACT are present. |
| B: 001 | Numerical information, represented in binary arithmetic. |
| C: 010 | Reserved for paper currency, including U.S. and foreign currency. |
| D: 011 | Alphanumeric, the full ASCII set of 128 codes as specified by ANSI, using seven BCB digits per code. The BCB digit position following the three format digits indicates "ASCII 128" if off (0) or "Other" if on (1). Thirty-two "Other" character sets including most Standards are defined by the next 5 BCB digits. |
| E: 100 | Emulation of all EAN & UPC symbols, but with enhancements. |
| F: 101 | Counterfeit protection for products and documents. |
| G: 110 | User defined. |
| H: 111 | Other universal unified BCB bar code symbologies defined by a second set of three format bits which follow to the first set of three format bits. |

As described above, BCB has the ability to switch, within a symbol, among these three basic formats: from Format A to B or D, from B to A or D, and from D to A or B.)

Referring to FIG. 1, the star shown with the stop pattern and the start pattern marks the boundary between the fixed width elements of the end patterns and the elements between the end patterns. All modules between the end patterns are required for the message, format and error control BCB data digits except the one module adjacent to each star (one white module next to the end pattern star and one black module next to the start pattern star). Please notice that the one black module next to the start pattern star is joined by another black module making a 2X black element. Also, the regularly spaced dotted lines, which are separated from each other by two modules, as shown below the elements in FIG. 1, mark the color transition found in the middle of every BCB data digit.

Character Placement Specifications for Standard BCB Formats

All standard BCB formats use a minimum of 8 BCB digits, are variable length and contain an even number of BCB digits; one leading BCB zero digit is added in the position to the left of the most significant digit of the message if required (none are required in the 1992 example).

With the nine module start pattern on the right, and counting to the left all the way to the eight module stop pattern, all BCB digit positions, two modules per position (see above and 1992 drawing) are numbered starting with 0 to the immediate left of the start pattern. This 0 position is the BCB parity digit position of the symbol, and the standard BCB format parity convention is even parity.

All BCB digit position numbers that are a binary power (1, 2, 4, 8, 16, . . . ) are used for "blended edac" as shown and as described in prior applications.

The least significant digit of the three standard BCB format digits is located in position number 3. For example: if BCB Format B (001) is to be used, position 3 would be loaded with a BCB 1 digit and positions 5 and 6 would each be loaded with a BCB 0 digit.

If no supplemental format digit positions are called for by the standard format as defined by positions 3, 5 and 6 (none are called for in Format B) position 7 represents the least significant binary digit of the message, position 9 represents the next to the least significant digit of the message (remember—all position numbers that are a binary power, such as 8, are reserved for edac) and so forth, until the most significant digit of the message is next to the stop pattern, or next to a leading zero, if required, which is next to the stop pattern.

EXAMPLE: 1992

To encode 1992 into BCB, call up the BCB Encoder Program, type 1992 and hit return. The BCB program selects Format B by determining that the message only contains numerical information and performs the following steps before displaying or printing the BCB Format B symbol representing the message 1992.

Convert 1992 to binary, 1992=11111001000, and append this binary with Format B digits 001 to get 11111001000/001 and set up as follows (the slash / is shown for illustration only):

message and format digits (information places)
1 1 1 1 1 0 0 1 0 0 0/0 0 1 19 18 17 <u>16</u> 15 14 13 12 11 10 9 <u>8</u> 7 6 5 <u>4</u> 3 <u>2</u> <u>1</u> <u>0</u> position numbers (see FIG. 1)

What now should be loaded into the five edac positions (16, 8, 4, 2, 1) to protect this message/format 11111001000/001 must be calculated. Write the position number, in binary form, of each information place that has a binary 1 (in this example, positions 19, 18, 17, 15, 14, 11 and 3) in column form as shown:

19=10011
18=10010
17=10001
15=1111
14=1110
11=1011
3=11

Each column must now be added (in binary) but the carry-over, if any, is discarded ("carryless addition") as shown below (i.e., the residue modulo 2, even parity, is calculated for each column):

19=10011
18=10010
17=10001
15=01111
14=01110
11=01011
3=00011

11001 these are the edac digits!

Load the calculated edac digits, 11001, as shown below; the edac positions are underlined. Determine parity and load the parity position, shown with a double underline; a BCB 0 digit is needed for this example:

message/format, edac & parity digits
1 1 1 1 1 1 0 0 1 0 0 1 0 0 0 0 1 0 1 0 19 18 17 <u>16</u> 15 14 13 12 11 10 9 <u>8</u> 7 6 5 <u>4</u> 3 <u>2</u> <u>1</u> <u>0̲</u> position numbers

Validating BCB

BCB symbols may be validated to detect if one or more character substitution errors, called a "switch" in BCB, are present by performing carryless addition on each column of the binary representations of each position number that has a binary 1, as shown below for this 1992 example; if the final result is 00000, two switches cannot be present (since no two position numbers are the same, no two switches can offset each other), and, if parity is correct, neither can one or three (or any odd number) be present. (If one switch were present, its position number would be the result.)

19=10011
18=10010
17=10001
16=10000
15=01111
14=01110
11=01011
8=01000
3=00011
1=00001
 00000

What are the odds of three or four switch errors occurring in a BCB symbol? To remote to be statistically significant even if poor printing is used in a harsh environment. However, if four switches (or 6, 8, 10 . . . ) were to occur in BCB, there would still only be a slim chance of fooling BCB's error control. What is most remarkable about BCB is that, not only are misreads a thing of the past, but BCB is also shorter, and BCB can produce much greater output:

BCB Standard Format Decode Algorithm System

The following is an outline description of a BCB standard format decode algorithm structure and data collection files which are keyed to the outline. Data collection files allow analysis of collected reading results.

I) When processing in real time, start the spreadsheet conversion operation (timing counts to integer values, described below) when a signal is received after a sufficient quiet zone.

II) Using the spreadsheet conversion operation, convert each module's worth of timing counts between ending patterns into a respective module bit, mb (one black module=1, two black modules=11, one white module=0, two white modules=00, etc.).

A. Confirm opposite ending pattern and that its quiet zone is sufficient.

Steps I and II may be performed while the timing counts are being accumulated

III) Separate module bits between ending patterns into pairs of module bits, each pair representing one BCB digit. Assign each pair a position number starting with position number zero (0) adjacent to the start pattern (this also orients the message).

A. If an odd mb is left over, generate no-read (all modules must be accounted for).

B. If the last position number adjacent the stop pattern is even, generate no-read (since position numbers started with 0, an even position number adjacent the stop pattern indicates that the number of pairs is odd, and thus a no-read condition).

IV) Check each above pair of module bits for a color error, i.e., a 11 or 00 pair: The sum of each pair that has no error should be 1 (0+1=1 and 1+0=1; if the sum is 0 (0+0), a void color error has occurred, and if the sum is 2 (1+1), a spot color error has occurred; such 0s and 2s should be counted for step IV A.

A. Flag each position number that contains a color error. If more than one position contains a color error, generate a no-read (the standard BCB error correcting level is one color error).

B. Drop the right module bit from each mb pair so that the remaining left bit is the BCB digit; retain position numbers with respective (left) BCB digits for edac check.

1. If no color errors:
   a. Check symbol parity; if off, generate no-read.
   b. Run edac check; if off, generate no-read.
   c. If OK, goto V, Interpret.
2. If one color error . . . error correction OFF: generate no-read. error correction ON:
   a. Check parity on all BCB digit positions; if parity is off, invert the BCB digit in the flagged (error) position.
   b. Run edac check; if off, generate no-read.
   c. If OK, goto V, Interpret.

V) Interpret the message:
   A. Determine the BCB format of the symbol from the 3 fixed position format digits.
   B. Generate output according to the symbol's format, separating message digits from format, edac and P digits as required.

Data Collection Files [bracketed references are to the Decode Algorithm System]

Whenever a no-read is generated, augment error data collection file (reference all no-reads to intended message):
   An odd number of modules detected [III, A].
      Record raw module bits between ending patterns.
   An odd number of module pairs (BCB digits) detected [III, B].
      Record raw module bits between ending patterns.
   More than one color error detected [IV, A].
      Count spots (11) and voids (00).
      Record raw module bits between ending patterns.
   For readings not requiring correction:
      Parity no good. Record BCB digits [IV, B, 1, a].
      Edac does not check out. Record BCB digits [IV, B, 1, b].
   For (one module) corrected readings:
      Edac does not checkout. Record BCB digits [IV, B, 2, b].

Whenever a good reading is generated, augment data collection file:
   Perfect reading, no color errors [IV, B, 1, c].
   Corrected reading, one color error [IV, B, 2, c].
      Count spots (11) and voids (00) so corrected.
      (Spots+voids=corrected readings.)
Decode software should allow BCB error correcting to be turned on and off; when off, corrected readings data collection files will be dormant.

Leading Zeros

In some bar code applications, leading decimal zeros are desired in numerical information. For example, it may be desired to print serial number 1 as 0001, with three leading zeros as shown, from the series 1 through 9999. This may be done, for example, in BCB standard format B for numerical information represented in binary arithmetic using the following steps:

Determine the maximum number of decimal places to be coded; in the example above the maximum number of places is four (9999). Therefore, multiply four by 3.32, 4×3.32= 13.28, and round up to an integer (for any possible fraction), 13.28 rounds up to 14, to determine how many total binary places should be encoded to equal the four decimal places. Convert the decimal message to binary and count the number of binary places required for the message (one binary place is required for the decimal message 1). The difference between 14 and 1, 13, is the number of leading zeros to be added to the one binary place of the message.

When decoding 13 binary zeros before this one binary place message in this example, 14 binary places total, divide 14 by 3.32 to get 4.22 (14/3.32=4.22). Round the quotient, 4.22, down to 4. The decimal message, 1, requires one decimal place, one, subtracted from 4, 3 (4−1=3), is the number of leading decimal zeros to add to the one decimal place message, 0001, as shown above.

Identifying and Interpreting Bar Code Characters by Pairs of Elements or by Individual Elements Typically, bar code symbols represent coded characters of a set, including, for example, binary characters, octal characters, decimal characters, alphabet characters, including lower case and upper case, the 128 ASCII character code set, and combinations thereof and/or selections therefrom. The subject of character sets gives rise to the subject of bar code efficiency (please see for example, "Bar Code Analysis, Part IIB," ©Cias Incorporated, 1991, a copy of which is filed herewith).

Bar code scanning apparatus including hand-held wands and other bar code reading devices measure and provide to bar code processing decoder means the number of timing counts that represent the relative width or extent of the bar and space elements individually, as pairs of elements, and from elements that may form patterns which represent characters within a bar code symbol. The bar and space elements typically have one or more different widths, one or more modules are used to construct an element. Characteristically, the bar elements are a darker color (e.g., black) than the lighter space (e.g., white) elements. The bar code reading means detects the different color characteristics of the bar and space elements.

The borders between the bar and space elements, where the detectably different characteristics of the bar and space elements are sensed, are called edges. The edges are color transitions. There are two kinds of bar code edges, leading edges, those going from white elements to black elements, and trailing edges, those going from black elements to white elements. In edge-to-edge codes, the separations between adjacent similar edges are measured, and in two-width codes, the widths of elements are measured. The timing counts that elapse between edges are counted and recorded as sensing means traverse the elements of a bar code symbol in various manners. Applicants refer to bar code timing counts as "ticks," the phrase stemming from the ticktock sound a time piece may make as it measures and records intervals of time.

In edge-to-edge symbologies, the series of timing count numbers produced by sensing means and representing the relative width of a pair of adjacent elements is converted to respective (whole) numbers of modules, integer module values. If the pair of elements is comprised of a bar then a space, that pair of elements is defined by two adjacent leading edges; if the pair of elements is comprised of a space then a bar, that pair of elements is defined by two adjacent trailing edges.

Figure 3:
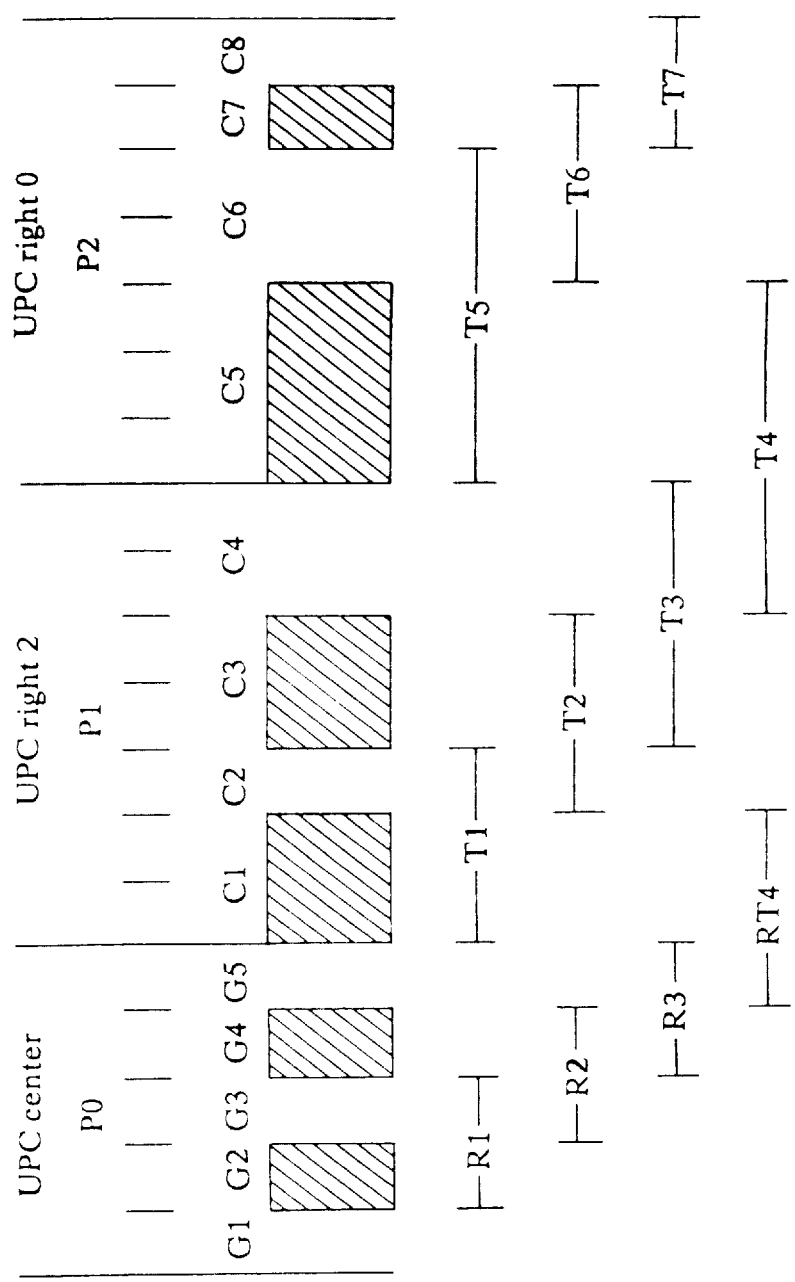
FIG. 3 represents a center pattern and two characters of a UPC symbol.

For example, referring to FIG. 3, which incorporates illustrations of the UPC center pattern (which may be considered to be a special UPC character) and two right UPC characters, the character two P1 and the character zero P2, the first element C1 of the character two equals 2 modules and the second element C2 of the character two equals 1 module. The pair of elements defined by T1 which includes elements C1 and C2 therefore represents the integer module value 3 (3 modules). When decoding, the number of ticks for elements C1 and C2 are added (or otherwise derived), this sum being the number of ticks comprising T1. This sum representing T1 in ticks must then be characterized or converted to an integer module value.

Once a method of performing the work has been designed, it comes down to the following: If a correct rounding decision is made, this sum will be correctly converted to a value of 3, meaning 3 modules (this subject is described further below). Similarly, the number of ticks comprising overlapping pair T2 will be derived and then converted or categorized to a value of 3 in this example. T1 and T2 are "overlapping" pairs of elements because pair T1 and pair T2 both include element C2. Thus, the pattern of elements, made up of the four elements C1, C2, C3 and C4 inclusive, represented by the T1 value 3, and the T2 value 3, i.e., T1=3 and T2=3, are then looked up in a table in order to identify which UPC character is represented.

In Volume 14, Number 1, 1975, of the IBM System Journal, in an article titled, "The Characteristics and Decodability of the Universal Product Code Symbol" (this article, filed herewith, is also referred to below), the authors Messrs. Savir and Laurer describe decoding a UPC symbol and they show how each UPC character is represented by a number of integer module values for respective T1 and T2 pairs of elements (please see FIGS. 11 and 12 on page 29 and the associated text of their article).

In sections numbered 4, "Reference Decode Algorithm," of AIM's USS's cited above for Code 128, Code 93 and Code 16K, for example, this method of interpreting the individual characters from each character's converted pairs of elements values is described for each respective symbology. In Code 128 and Code 93 four such pair values for each character are used because each character has six elements representing it while in UPC each character has only four elements representing it. According to these USS's, characters are interpreted as follows: "Look up the character in a decode table using the four values, T1, T2, T3, and T4 as the key" (for example, please see USS Code 128, section 4, page 6).

Code 16K for example, which a two dimensional bar code, uses 8 UPC characters to define the line numbers of the symbol, and all Code 128 characters for the coded message and overhead. Interpreting the characters is the same as described above. This is how edge-to-edge symbology characters are decoded: integer module values from similar edges representing pairs of elements between similar edges are looked up directly in a table.

In another approach typically used with two-width symbologies (and which may also be adapted and used with edge to edge symbologies like UPC), characters are identified and decoded from the widths of individual elements. Individual elements widths are directly converted to module values (characterized) and the element widths are looked up directly in a table. The series of timing count numbers produced by sensing means and representing the relative width of individual elements (not pairs of elements) must first be converted using a calculated threshold into either narrow or wide elements, since these are the two widths of elements used. This threshold value is calculated according to respective symbology convention as described in AIM's USSs.

AIM's USS's cited above for Code 39, I 2/5 and Codabar describe this two-width symbology method of interpreting characters from patterns of individual elements. For example, please see the Code 39 USS, page 3, section 4, paragraph 2d: "Determine if pattern of wide and narrow elements matches a valid character from the allowable set."

U.S. Pat. No. 3,723,710 of Crouse et al. describes edge-to-edge decoding of a bar code using two different element widths and edge-to-edge decoding of another bar code using three different element widths. The bar coded character representations in both Crouse et al. bar codes were defined only in terms of edge-to-edge measurements, similar to UPC, Code 128 and Code 93 described above.

Crouse et al's. decoding categorizes edge-to-edge measurements representing overlapping pairs of elements, T1, T2, T3 and T4 inclusive (please see for example, col. 4, lines 16 to 25 and lines 65 to 67, and Table II, and col. 9, lines 63 to 65 and Table III) for the reasons they describe (please see col. 3, line 56 to col. 4, line 27) so that these categorizations of pairs of elements can be looked up in a table for character identification.

As is known in the art, there are two general approaches to identifying or interpreting particular patterns of bar and space elements into corresponding characters: the approach of interpreting the edge-to-edge decoded module values of pairs of elements directly into characters, and the approach of decoding the elements individually based on a calculated threshold into narrow and wide elements and interpreting these decoded individual elements directly into characters.

Applicants' decoding invention for symbologies such as those discussed above works differently. Applicants convert edge-to-edge measurements of pairs of elements into integer module values for both edge-to-edge and, remarkably, for two-width symbologies as well, but applicants do not need to look up pairs of elements' module values in a lookup table for character interpretation (although they could readily do so).

Applicants add a new step to the decoding process prior to character interpretation; that step is the separation of a sequence of pairs of elements into a sequence of individual elements, that sequence of individual elements representing the pattern of a possible character from the allowable character set. After separation, that sequence of individual elements is looked up to determine if it matches any character in a listing of the valid characters of that character set. The listing table used for this character lookup operation must itself be in the form of individual element sequences in order for valid character match up to occur.

The new step works as follows: The integer module values converted from ticks representing pairs of elements are first broken down into individual elements, and the resulting pattern or sequence of individual elements derived from these edge-to-edge measurements is then interpreted into characters by directly comparing the derived sequence of individual elements that (may) represent a character to a lookup table containing a listing of individual elements for the valid characters of that symbology.

Thus, applicants first measure and then categorize pairs of elements into integer module values, and bar coded representations of characters may be identified and decoded from these categorizations alone. Or, the integer module values of a character's individual element sequence may be derived from these categorizations using applicants' separation step described below, and characters may then be identified and decoded from their individual element sequence.

In one preferred embodiment, applicants' new decoding technique converts every edge-to-edge measurement from every overlapping pair of elements from one end of a bar code symbol to the other end continuously, with no gaps, no missing pairs of elements, and further, separates these pairs of integer modules into integer modules representing individual elements for lookup so that sequences of individual elements, and not pairs of elements, may be interpreted into characters. Applicants use edge-to-edge conversions of pairs of elements continuously, continuously breaking the pairs into individual elements one element at a time.

By way of example, this separation process may be performed following these steps. Typically, respective bar codes have fixed end patterns. The integer module value of each individual element of a fixed end pattern may readily be determined once such a pattern has been identified through conventional means. The last element of such a known pattern, which therefore is itself known, forms a pair of elements with the immediately adjacent unknown element from the yet unknown neighboring pattern. This pair of elements, one known and one unknown, is characterized or converted to an integer module value representing this unmatched pair of elements.

The unknown element of this pair is decoded as follows: The known element's module value is subtracted from the module value calculated or otherwise characterized for the pair of elements; what remains is the integer module value of the unknown element.

Once the integer module value of the unknown element is known, this process can be repeated on the next following overlapping pair of elements comprised of the most recently decoded and therefore known element and the next unknown element, and repeated again, and repeated over and over until all unknown elements have been thus decoded. As each set of four elements is in turn decoded into individual module values, the parity and then the identity of UPC coded characters may be decoded.

Referring to FIG. 3 by way of illustrated example: The UPC symbol and its center pattern P0 may be identified through conventional means. The center pattern P0 is comparable to a known character pattern. The last element of P0, G5, is itself known by convention to be 1 module wide. Element G5 forms a pair of elements RT4 with the immediately adjacent although yet unknown element C1 from the neighboring character pattern P1. This pair of elements G5 and C1, one known and one unknown element, is converted (as described below) to an integer module value of 3. The unknown element of this pair is then decoded as follows: G5 which is 1 module is subtracted from RT4 which has been decoded as 3 modules; what remains is the integer module value 2 for C1 the unknown element.

Once the integer module value of element C1 is decoded and known, this process can be repeated on the next overlapping pair of elements TI comprised of elements C1 and C2: C1 is 2 modules, subtracted from T1 which is, if correctly characterized or decoded, 3 modules; what remains is the module value 1 for C2.

Once the integer module value of element C2 is also decoded and known, this process can be repeated on the next overlapping paid of elements T2 comprised of elements C2 and C3: C2 is 1 modules, subtracted from T2 which is, if correctly characterized or decoded, 3 modules; what remains is the module value 2 for C3.

Once the integer module value of element C3 is also decoded and known, this process can be repeated on the next overlapping pair of elements T3 comprised of elements C3 and C4: C3 is 2 modules, subtracted from T3 which is, if correctly characterized or decoded, 4 modules; what remains is the module value 2 for C4, and so on until all unknown elements of the entire symbol have been decoded in turn. These operations are also repeatedly shown below in the spreadsheet tables included in this application: current column F less the previous column G equals the current column G; next column F less the current column G equals the next column G, and so forth.

At this point, however, the parity of UPC character P1 in FIG. 3 may be identified as follows: C1 and C3 have been decoded as values 2 and 2, a total of 4 modules which is even parity, which makes P1 according to UPC convention a right character (please see Savir et al's. article, pages 27–29 including FIG. 8, and the "U.P.C. Symbol Specification Manual," cited in more detail below, page 6, section 2.1.1).

The character P1 may now be identified and interpreted as follows: C1, C2, C3 and C4 have been decoded as values 2,1,2,2 respectively, which may be represented in UPC binary notation (ones=one module's worth of a bar element, and zeros=one module's worth of a space element) as 1101100.

Now, putting together what has been identified as an even parity right character with the decoded integer module values for the four individual elements C1, C2, C3 and C4, 2,1,2,2 respectively, or 1101100, of the character P1, a table or listing or the like for UPC right characters, may be effectively compared to these four individual elements values in order to determine if they match any valid characters of the UPC right character set. As shown in the following listing, 1101100 matches the UPC right character 2 (T1 and T2, described above, are also shown in this listing for comparison but T1 and T2 are not used for lookup in applicants' approach):

| UPC Right Character Listing | | |
|---|---|---|
| value | modules | T1, T2 |
| 0 | 1110010 | 5, 3 |
| 1 | 1100110 | 4, 4 |
| 2 | 1101100 | 3, 3 |
| 3 | 1000010 | 5, 5 |
| 4 | 1011100 | 2, 4 |

-continued

UPC Right Character Listing

| value | modules | T1, T2 |
|---|---|---|
| 5 | 1001110 | 3, 5 |
| 6 | 1010000 | 2, 2 |
| 7 | 1000100 | 4, 4 |
| 8 | 1001000 | 3, 3 |
| 9 | 1110100 | 4, 2 |

Thus, what character is represented by 2,1,2,2 may be identified; what has been decoded and identified in a fully self-checking way is a (valid) right UPC character two. Notably, the difficult issue of ink spread (described below, in the Savir et al. article, and in col. 3, line 56 to col. 4, line 24 of the '710 Crouse et al. patent), is not involved in applicants' decoding; ink spread distortion is 100% avoided in applicants' pure edge-to-edge decoding.

When decoding BCB elements in similar fashion, individual elements of an integer module value of 2 may be further divided according to BCB convention into respective BCB binary digits. For example, a sequence of four individual BCB element values of 1221, representing 011001 in BCB notation (as above, ones=one module's worth of a bar element, and zeros=one module's worth of a space element), may be separated into three BCB characters 01,10,01 which in BCB equals the binary digits of 0,1,0 respectively.

UPC Character Ambiguities

The Uniform Code Council, Incorporated, located at: 8163 Old Yankee Road, Dayton, Ohio 45458, published: "U.P.C. Symbol Specification Manual," in January 1986 and it was reprinted in January 1992. It is a description of the Universal Product Code bar code, often referred to as just: UPC, the supermarket code. UPC was invented and adopted in America, circa, early seventies. The UPC code was selected by a committee, the Uniform Grocery Product Code Council, Incorporated, which delegated final selection to a subcommittee, the Symbol Standardization Subcommittee, which engaged a consultant, McKinsey and Company, Incorporated. Despite these extensive efforts, technically, UPC missed the mark; UPC's propensity to misread is much greater than that of other popular bar codes.

For comparison for example, please see AIM's "Final Report" (©1992 AIM U.S.A., a copy of which is filed herewith) of the Ohio University bar code test conducted by AIM in 1991 at the request of HIBCC, the Health Industry Business Communications Council. Page 14 reports the results. UPC misread twenty times more than Code 39 and twenty times more than Code 128. Code 39 and Code 128 misread once each, while UPC misread 21 times (a total of 23 misreads were reported). According to various bar code test reports, UPC is many times worse than other popular bar codes.

Today, UPC is used in many industries. For example, use within our nation's health care system is well established and growing rapidly; here, mistakes can cost more than time and money. A similarly structured companion bar code, EAN, is used throughout Europe and other parts of the world. IBM Corporation published an article referred to below by Messrs. Savir and Laurer, Volume 14, Number 1, 1975, in the IBM System Journal: "The Characteristics and Decodability of the Universal Product Code Symbol."

Structurally, UPC is a self-checking decimal code because its ten valid seven-bit (1 bit=1 module) character patterns are each at least two bits different from each other (in error control parlance, providing a minimum Hamming distance of two, similar in form and function to basic binary parity). Therefore, if any one bit fails (inverts), the resulting pattern cannot mimic any other valid pattern and the parity error will thus be detected. Structurally then, UPC is not flawed in regard to self-checking decimal structure.

However, the known UPC decode processes and methods do not decode by bits, they decode by other means, as described, for example, above and in the Savir et al. article cited above, pages 29 and 30. UPC requires two decode schemes because the primary decode scheme is octal, it can only discern eight different character patterns, not ten. UPC's decoders are flawed, not its structure:

The primary UPC decode scheme uses a look up table not of bits but of edge-to-edge (integer) module values, that is, referring to FIG. 3, the number of modules in the two pairs of elements defined by T1 and T2 of a given UPC character are looked up in a table. This operation is self-checking as Savir et al. point out because an error of one module in either T1 or T2 but not both will cause a parity error in the decoded character, and a mistake will be avoided because the error will be detected, but this primary decoding scheme for UPC is only octal: the T1 and T2 module value for the character one and the character seven are identical, and the same is so for the characters two and the eight (also, please see, Bar Code Symbology, by Dr. Allais, page 8, column 1).

These four characters of UPC, one and seven, and two and eight, are ambiguous when decoded by the primary UPC edge-to-edge T1 and T2 decode lookup; the other six UPC characters, zero, three, four, five, six and nine, are each unique and thus distinct when (only) decoded by the primary T1 and T2 lookup. As described, the primary T1 and T2 UPC decoding lookup is self-checking.

Savir et al. describe two secondary UPC decoding schemes to distinguish between the characters one and seven and to distinguish between the characters two and eight; neither is self-checking in any conventional sense, however.

Savir et al's. T4 approach: referring to FIG. 3 illustrating the UPC character two P1 and the UPC character zero P2, for example, Savir et al. suggest to subtract element C5's known module value (C5=3 modules, see below) from a pair of element's T4 known module value (T4=5 modules) when this pair of elements T4 includes one element from each of two neighboring character patterns P1 and P2 in order to distinguish this UPC character two P1 from a UPC character eight (not illustrated in FIG. 3); element C5 is known because in this Savir et al. T4 approach, character P2 must be decoded before character P1. Therefore, T4, 5 modules, minus C5, 3 modules, equals C4, 2 modules; if C4 is 2 modules character P1 must be a UPC character two and not a UPC character eight (because C4 in a UPC eight is 3 modules).

However, without more, if T4 is mistakenly rounded to 6 modules instead of the correct 5 modules shown in FIG. 3, the UPC character two will be misinterpreted as the eight; one rounding mistake on T4 and no other error can cause a character substitution error. Thus, this secondary UPC T4 decoding approach is not self-checking.

Self-checking refers to an inherent character checking scheme for a bar code based on parity that detects all occurrences of one color error appearing within a character such that character substitution errors can only occur if two or more independent "printing" defects appear within a single character (please see "Bar Code Symbology," by Dr. David C. Allais, page 2, ©May 1985 Intermec Corporation 602682B). A single color error occurs when one module is mistaken for the wrong color. Also, please see "Bar Code Analysis, Part IIB," page 22, cited above. A code may be responsibly called self-checking only if all its characters are self-checking when decoded.

In addition to applicants' more innovative and comprehensive solutions to UPC decoding described herein, applicants also describe an improvement to the Savir et al. secondary T4 approach (admittedly only a band-aid for too large a flaw): Referring to FIG. 3 by way of example, applicants propose to distinguish, when possible, the (illustrated) UPC character two from the character eight (not illustrated) by the T4 approach Savir et al. described, but applicants also perform the following additional steps, when possible, to confirm the T4 approach result:

Still referring to FIG. 3: subtract element G5's known module value (G5=1 module) from a pair of element's RT4 known module value (RT4=3 modules) when this pair of elements RT4 includes one element from each of two neighboring patterns P0 and P1 in order to distinguish this UPC character two P1 from a UPC character eight (not illustrated in FIG. 3); element G5 is known because in this augmented Savir et al. T4 approach, both character P2 and the center pattern P0 must be decoded before character P1. Therefore, RT4, 3 modules, minus G5, 1 module, equals C1, 2 modules. Just as if C4 is 2 modules character P1 must be a UPC character two (from above), if C1 is 2 modules character P1 must be a UPC character two and not a UPC character eight (because C1 in a UPC eight is 1 module).

Thus, the first and last element of ambiguous UPC characters may be decoded according to applicants' augmented T4 approach into integer module values; this is somewhat self-checking as far as it goes. If the thus decoded first and last elements of an ambiguous UPC character each indicate a different ambiguous UPC character, a mistake has been made; unless both the first and last elements indicate the same ambiguous UPC character, a mistake is readily detected.

Thus, the separating of two pairs of elements into respective individual elements, two of such separated elements in part comprising one UPC character, may be useful to accurately identify ambiguous UPC characters because single decoding mistakes involving one pair of elements may be detected.

However, a weakness in applicants' augmented T4 approach is that it cannot be performed an all ambiguous UPC characters similarly because it requires decoding the patterns to both sides of each ambiguous UPC character first, as described using FIG. 3. It would not be possible to do this as described, for example, if character P2 in FIG. 3 were also an ambiguous character. The overlapping pair of elements connecting two ambiguous UPC characters limits the effectiveness of applicants' augmented T4 approach.

Savir et al's. other secondary UPC decoding scheme, called their ink check approach by applicants, to distinguish between the UPC characters one and seven and the characters two and eight is not an edge-to-edge solution at all but rather what appears to be the antithesis of edge-to-edge decoding. This ink check approach involves measuring the width of a bar, correcting for systematic error (ink spread), and deciding whether the width of the bar is one or two modules wide and decoding the character in question accordingly.

It appears to the applicants after studying the Savir et al. article that this ink check secondary approach is what Savir et al. wanted to avoid in the first place. For example, page 22: "We illustrate the power of this [primary T1 and T2 edge-to-edge] decoding technique by examining the phenomenon of inkspread, . . . ." Be that as it may, this secondary approach (and similar approaches) is ink spread dependent and not self-checking in a conventional meaning either.

Another reason this second ink spread approach is weak is because ink spread may vary or appear to vary within in a printed UPC symbol. Certain phenomenon are similar in effect to that of ink spread. For example, a UPC symbol may be positioned on a curved surface so that the elements from part of the symbol face more squarely to the scanner. These elements may thus provide different reflection intensity compared to elements in other parts of the symbol which are (more) angled to the scanner.

Other phenomenon that give similar effect to that of printed ink spread may involve, for example, the laser dot used for scanning. If while traversing an edge in a symbol, the dot senses the color transition while it is located equally over two elements, the effect of ink spread is not introduced. However, this is easier said than done. If a color transition is sensed otherwise than half and half over two elements, the effect of ink spread distortion is added or subtracted. An elliptical "dot," such as used by PSC, Incorporated, of Webster, N.Y., is helpful to reduce this effect: If the axis of the elliptical dot is somewhat parallel to the bars, the effect of dot introduced ink spread distortion is lowered while the elliptical shape maintains signal to noise ratio. (The elliptical dot may also help to reduce the effect of edge noise.)

One point is that the effect of ink spread, whatever the cause, is not necessarily systematic within a symbol. Savir et al. however, describe ink spread as systematic error.

Previous secondary UPC decoding schemes to distinguish between the UPC characters one and seven and between the characters two and eight are not adequately self-checking. While UPC is not flawed structurally as a decimal bar code in this regard, the decimal decoder methods, processes and devices for UPC have been flawed. Applicants believe that element pair lookup is not necessarily able to sufficiently resolve all the definition (e.g., self-checking definition, parity) found in bar code patterns, and that element by element lookup is inherently superior. UPC is 60% self-checking (six unambiguous characters), and 40% is not (four characters are ambiguous). This 40% is the achilles heel when decoding UPC. UPC has been introduced and accepted world-wide as a self-checking bar code; technically, this was a mistake because it was not.

However, applicants' new decode inventions increase the self-checking level for UPC, from 60% to 100%, UPC becomes fully self-checking, meaning that two modules within a character pattern must be decoded in error for a character substitution error to occur—and all ten UPC characters can be decoded purely edge-to-edge without need for any secondary decoding schemes whatsoever.

Code 93 is an example of a code that is not structurally self-checking. The character E, for example, can be transposed into an R by one spot affecting one module. However, Code 93's level of self-checking improves using applicants' decoder, and additional new decoding benefits abound as well, as described below.

Decode Rounding Decisions

The conversion or characterization of pairs of elements (or individual elements) into integer module values is the very heart of decoding a bar code symbol, this is where the rubber meets the road, where decoding mettle is tested, this is the hard part, fraught with four distortions, listed in order or concern:

1) ink spread,
2) noise, systematic (affecting every edge) but randomized edge error,
3) spikes, non-systematic but higher levels of randomized edge error, and
4) acceleration.

There are but four distortions when deciphering the elements of a bar code symbol. High levels of these bar code distortions wreak havoc with the series of timing count numbers, leaving them in disarray, seemingly scrambled, hence the conversion difficulties. Enough order remains, however, even if the distortions are great, to do the job.

A most fundamental operation in bar code decoders is an operation that makes a yardstick to measure a sample, and it involves four edges: two edges to make a reference distance calculation with which a sample distance defined by a different set of two edges may then be calculated and decoded (or characterized) into the length of the sample distance as measured in (whole) modules, the integer module value.

Applicants' decoder does this is two distinct steps:

Step 1): the timing counts between a first pair of edges, the reference edges defining the reference distance, for some (even) number of consecutive elements is divided by the known and/or decoded number of modules represented by these consecutive elements; the result is the average timing counts per module, the local average, Z.

Step 2): the timing counts between a second pair of edges, the sample edges defining the sample distance, comprising an unknown (total) number of modules is divided by Z in order to decide how many (integer, whole) modules are represented between the sample edges. The quotient of: (sample distance in ticks)/Z is rounded (to the nearest whole number).

Other published decode algorithm systems perform this operation differently, combining in one fundamental step both the reference distance and the sample distance.

However differently performed, the essence of this most basic operation concerns decode rounding decisions which must be made. Which two reference edges, and which two sample edges, and how they are utilized and in what sequence of operations, is what differentiates decoders and symbologies from each other and from applicants' because which two reference edges and which two sample edges and how they are utilized and in what sequence of operations, controls the accuracy and effectiveness by which rounding decisions can be made.

For example, in certain preferred embodiments of their decoder, applicants use more than two edges in order to make their reference calculations more accurate, and further, applicants' two sample edges straddle (or bracket) one of their reference edges, an outside reference edge if more than two reference edges are used; a (outside) reference edge separates applicants' sample distance into two elements. Straddling, discussed further below, supports the measuring of the extents of a sequence of overlapping pairs of elements included in the coded data to establish a sequence of reference distances.

Figure 6:
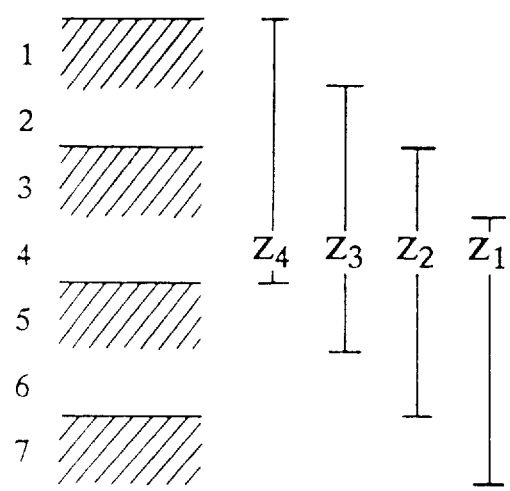
FIG. 6 represents the independent median approach to establishing Z, the local average, by which to measure; four Zes, each separated by 4 elements, are shown.

For example, referring to FIG. 6, seven bar code elements, numbered 1 through 7, are illustrated vertically. The odd numbered elements are bars and the even numbered elements are spaces. Four reference distances are also illustrated, $Z_4$, $Z_3$, $Z_2$ and $Z_1$. Each reference distance, made up of two pairs of elements, includes four elements:

$Z_4$ includes elements 1, 2, 3 and 4; $Z_3$ includes elements 2, 3, 4 and 5; $Z_2$ includes elements 3, 4, 5 and 6; and, $Z_1$ includes elements 4, 5, 6 and 7.

A reference distance, Z, may refer, for example, to the total extent of the respective four elements (the sum of the four elements' timing counts), or, reference distance, Z, may refer to the four elements' timing count sum divided by the number of modules they represent, the local average.

For example, the reference distance $Z_4$ equals the sum of the timing counts in elements 1, 2, 3 and 4 divided by the number of modules $Z_4$'s four elements represent; the reference distance $Z_3$ equals the sum of the timing counts in elements 2, 3, 4 and 5 divided by the number of modules $Z_3$'s four elements represent; the reference distance $Z_2$ equals the sum of the timing counts in elements 3, 4, 5 and 6 divided by the number of modules $Z_2$'s four elements represent, and so forth.

As shown in FIG. 6 by way of example, reference distance $Z_4$'s elements, 1, 2, 3 and 4, overlap three elements of $Z_3$, namely elements 2, 3 and 4. Reference distance $Z_3$'s elements, 2, 3, 4 and 5, overlap three elements of $Z_2$, namely elements 3, 4 and 5. Reference distance $Z_2$'s elements, 3, 4, 5 and 6, overlap three elements of $Z_1$, namely elements 4, 5 and 6, and so forth. In this manner, the extents of a sequence of overlapping pairs of elements, in this example, two pairs of elements (it could be as few as one pair), included in the coded data are each measured to establish a sequence of reference distances, as shown in FIG. 6, $Z_4$, $Z_3$, $Z_2$ and $Z_1$. Different ways of establishing a sequence of reference distances with which to measure a sequence of sample distances are described below.

In one embodiment of applicants' decoder, reference distance $Z_4$ is used to categorize the sample distance comprised of a pair of elements, elements 4 and 5, which straddle one edge of the reference distance; reference distance $Z_3$ is used to categorize the sample distance comprised of a pair of elements, elements 5 and 6, which straddle one edge of the reference distance; reference distance $Z_2$ is used to categorize the sample distance comprised of a pair of elements, elements 6 and 7, which straddle one edge of the reference distance; and so forth.

Figure 7:
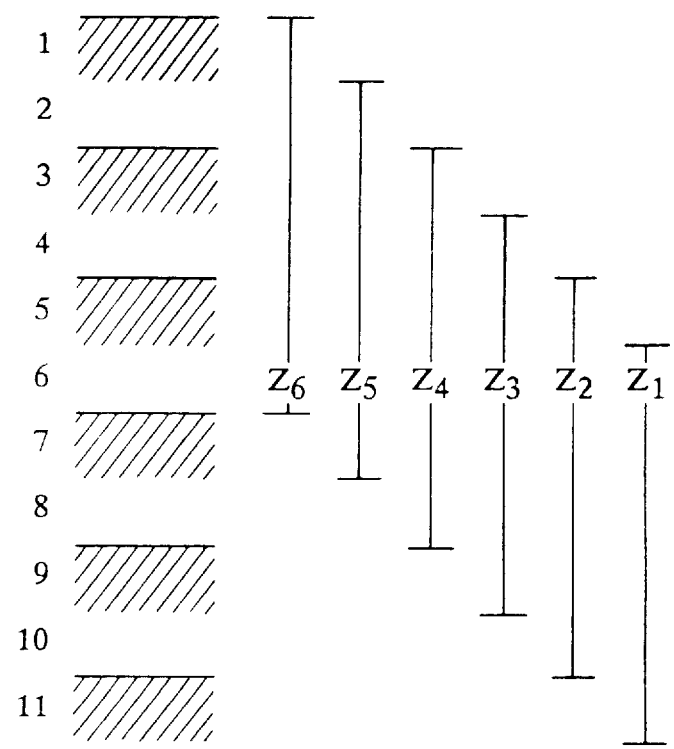
FIG. 7 represents the independent median approach to establishing Z, the local average, by which to measure; six Zes, each separated by 6 elements, are shown.

Referring to FIG. 7 for another example, eleven bar code elements, numbered 1 through 11, are illustrated vertically. The odd numbered elements are bars and the even numbered elements are spaces. Six reference distances are also illustrated, $Z_6$, $Z_5$, $Z_4$, $Z_3$, $Z_2$ and $Z_1$. Each reference distance, made up of three pairs of elements, includes six elements, whereas in FIG. 6 each reference distance includes two pairs of elements as described. FIGS. 6 and 7 work similarly in other respects. Reference distances may include any number of pairs of elements including only one pair of elements. FIGS. 6 and 7 are also described below in association with other ways of establishing a sequence of reference distances with which to measure a sequence of sample distances.

Applicants' methods, devices and systems are also described as follows for decoding a bar coded representation of characters that includes a plurality of bar elements separated by space elements which have detectably different characteristics than the bar elements, and in which the bar and space elements have one or more different module widths and are separated by edges defining transitions between adjacent elements, and include means to perform the following steps and operations:

Distances between adjacent leading edges of the bars comprising the bar coded representation of characters are measured, typically in timing counts. The distance between adjacent leading edges defines a pair of elements therebetween including a bar element and a space element, respectively.

Distances between adjacent trailing edges of the bars comprising the bar coded representation of characters, are measured, typically in timing counts. The distance between adjacent trailing edges defines a pair of elements therebetween including a space element and a bar element, respectively.

A number of reference distances, which are included in the bar coded representation of characters, are measured, typically in timing counts, so that a sequence of said reference distances is established in which adjacent reference distances overlap, as described above in association with FIGS. 6 and 7. A reference distance may cover one pair of adjacent reference elements or more pairs of adjacent reference elements. The reference distances shown in FIG. 6 each include two pairs of elements (4 adjacent elements) and the reference distances shown in FIG. 7 each include three pairs of elements (6 adjacent elements).

The distances defining pairs of elements between adjacent edges are categorized with respect to reference distances. This categorizing step, for example, involves converting the measured timing counts into integer module values.

The reference distance used in the categorizing step may be gotten from more than two edges. For example, an average of more than one reference distance may be used in the categorizing step.

As is known, a bar coded representation of characters may be identified and decoded from the categorizations.

Applicants also describe other steps that may be used to identify and decode bar coded representations of characters. In one other step, the categorizations are separated into sequences of individual bar and space elements. After this other separation step, the sequences of individual bar and space elements are identified and decoded into bar coded representations of characters as described above.

Straddling

Straddling occurs when the two sample edges straddle (or bracket) one of the reference edges being used to convert or categorize the sample distance to modules. Straddling fosters several decode benefits, including for example, allowing edge-to-edge pair decoding with individual element-by-element separation and identification described above, and, as described below, an individual edge correction scheme called cooking, which improves the accuracy of subsequent rounding decisions which must be made. Cooking further provides a required mechanism to implement applicants' rounding decision correction logic, a powerful and unique symbology dependent decode logic strategy that avoids rounding decision errors based on a symbology's inherent structure. Straddling also gives rise to reverse processing which allows two, not just one, but two decodes of each scan data set because straddling makes applicants' decoder directional.

In practice, bar code rounding decisions are difficult because distortion listed above is always present. Typically, if even one such decode rounding decision is made incorrectly, that entire set of scan timing count data is rendered useless, a wasted scan, and the decoder must start anew with a fresh set of scan timing count data. This is why applicants' bar code error correcting features are so valuable—such waste is salvaged and perfectly good bar code readings result; in fact, scans with what would otherwise include many incorrect decode rounding decisions are also salvaged.

Sample UPC Decoding

Applicants have successfully tested and run decoding approaches including straddling in computer bar code decoding simulation tests on their BCB symbology as well as on the UPC symbology. For example, the 21 reported UPC misreads from AIM's Ohio University bar code test (Final Report, cited above) were run using applicants' decoder as follows:

AIM's Final Report listing of the timing counts for each of the 21 UPC misreads, and these timing counts were keyed into a spreadsheet program written by applicants (Lotus was used). Please see Appendix A, which contains 24 spreadsheet pages, one page per reported UPC misread from the Ohio University bar code test for AIM (21 processed in one direction and 3 also reversed processed), pages 1–25 including one summary page, filed herewith in support hereof. Column B' on each page thereof contains one set of timing counts as reported by AIM for each of the 21 UPC misreads (please see Final Report).

Applicants started their processing at the top end of the UPC symbol and not from the center pattern (which they prefer to do), the top end, as one would read the timing counts printed in the Final Report, and they decoded in that direction only (top to bottom). (Applicants prefer to decode UPC starting from the center pattern because one more pair of fixed elements (one module each) is available in the center.)

Their processing startup used the first six elements (elements numbered 1 to 6 on the spreadsheets), not counting the bloom bar (2 from the end pattern and 4 from the first character), which includes 9 modules (2 modules in end pattern and 7 modules in the first character), to establish the first reference distance. This first reference distance was used to decode (characterize) the sequence of sample pairs which includes four overlapping pairs of sample elements starting with the first pair of elements which includes one known element from the end pattern (its integer module value is found in column G line number 2 on the spreadsheets; column G in lines 0, 1 and 2 comprised the three fixed one-module elements comprising UPC's given end pattern), and one (initially) unknown element from the first character (the element from line number 3 on the spreadsheets), and ends with the fourth pair of elements which includes the last two elements (elements from line numbers 5 and 6 on the spreadsheets) from the first character (next to the second character which begins with the element from line number 7 on the spreadsheets).

Referring to the spreadsheets, column D on the four lines, 2, 3, 4 and 5, contains this first established reference distance, Z, since this first Z is used four times as described and shown in the spreadsheets. Each line of the spreadsheet adds one element (column B') and its edge (column A') to be processed.

On each line Z from column D is divided into its respective column C. Column C contains the timing count sum of each respective sample pair of elements, the sample distance. This sample pair contains the current line's element which is unknown and the previous line's element which is known either because it is part of a fixed end pattern (or center pattern), or because its has (just) been decoded.

For explanation, applicants' edge correction embodiment called cooking may be turned off (cooking is described in subsequent examples). Without cooking, columns E', A, B and L are superfluous. Columns H, I, TICK DIFF and K are for analytical purposes and not involved in actual processing.

Without cooking, column E would contain the quotient of this division which is performed on every line: column C/column D=E. After this division on each line, column E is then rounded and the resulting integer is entered into column F—this is the critical rounding decision that is made in sequence on each line of applicants' spreadsheet illustration of their decoder. This sequence of rounding decisions results in the integer module value sequence shown in column F. Column F is used to establish a sequence of column D reference distances, Z,Z,Z, . . . , because the denominator used on each line to calculate Z may be derived from adding a sequence of elements from column G, and column G elements are derived by separating the two elements represented in column F, or the denominator used on each line to calculate Z may be derived from column F directly.

A preselected minimum of six modules and a preselected minimum of two pair of elements was used to establish subsequent reference distances; two or three pairs of elements, which is 4 or 6 elements, separated the two edges used for each reference distance as follows (note that one pair of elements with 7 modules is possible in UPC, e.g., if the right character six is followed by a right character zero or nine, a 7X pair results):

The timing count sum of two pairs of elements (4 elements) is shown in column C'; C' includes the sum of the ticks in the current element B' and in the 3 prior elements (shown immediately above on the spreadsheet). The number of modules in each line's C' is shown in column F'; F' includes the sum of the modules in the current (decoded) element B' and the 3 prior column B elements.

Likewise for three pair: The timing count sum of three pairs of elements (6 elements) is shown in column C"; C" includes the sum of the ticks in the current element B' and in the 5 prior elements. The number of modules in each line's C" is shown in column F"; F" includes the sum of the modules in the current element B' and in the 5 prior column B elements.

These preselected minimums were automatically selected to establish the local average reference distance, Z, during the processing of each line after the startup of four overlapping pairs of sample elements mentioned have been decoded. This was based on column F' as follows: column C' was divided by column F' to get column D(Z) if column F' was 6 (modules) or more, and if column F' was less than 6, column C" was divided by column F" to get column D(Z). However Z is calculated on a particular line, Z is then entered into column D on the next line.

As mentioned above, reference Z from column D is divided into its respective column C sample pair of elements to yield column E which is rounded into column F which is the integer module value of the sample. The integer module value from the known element included in column C is then subtracted from the module value in column F, and the result which is entered into column G is the integer module value of the no-longer unknown (current) element which is (was) included in the pair of elements of column C. This process repeats, over and over it repeats until all data elements of the symbol are decoded in turn into a corresponding sequence.

Each spreadsheet line goes through one cycle as described and yields one more decoded and thus known element. Each new known element forms an edge-to-edge pair with the next unknown element so it can be decoded in turn—this is how progress is made, how suspension bridges are built— each advance supports the next. These are fundamental steps that lead to the deciphering of the message coded in the elements of a bar code.

In these 21 spreadsheets, cooking, described below, was used with a threshold set at + or −0.20X. Cooking was started early, i.e., cooking was started on the pair of elements' edge which included one element from the end pattern and one element from the first character (element numbers 2 and 3 on the spreadsheets). No logic correcting, described below, was used in these sample processings of UPC timing count data.

Applicants' computer bar code decoding simulation tests using their straddling approach produced these results: The 21 sets of scan data that produced the 21 misreads in the AIM test at OU were processed (decoded) once in same direction as OU. Only 2 fooled applicants' decoder, those 2 resulted in the identical 2 misreads; 3 AIM misreads were salvaged and corrected into good readings, which even surprised applicants (however, just imagine the increase in output productivity based on salvaging the vast number of UPC no-reads from the OU test); and, 16 misreads became detected errors, those 16 misreads became no-reads.

When the two misreads that survived the decoder in one direction were processed in the other direction, they too became detected errors, no-reads. Of the 3 good readings, when reversed processed, 1 remained a good reading and the other 2 produced no-reads.

Admittedly, this is not a comprehensive test by any stretch of the imagination, but, based on this improvement alone, the OU misread rate was over 1000% higher than applicants' decoder when only one direction was compared, and if good readings in two directions are required, applicants' decoder rejected these 21 troublesome misreads 100% of the time. Also, applicants' improved directional decoder straddling operation has been disclosed and illustrated successfully decoding UPC.

Directional Decoding with Four Edges

During operation in typical (n, k) and related bar code decoders, but not during applicants' decoder operation, one of the two reference edges is common with (the same edge as) one edge of the two edges defining the sample, but not all the time. In the relevant decode step of Code 128 and Code 93, for example, one reference edge is the same edge as one sample edge for one out of the four categorizations for each character (T1 of the four: T1, T2, T3 and T4): the left reference edge of p is the same edge as the left edge of sample T1 (please see AIM's USS's for Code 128 and Code 93, both FIG. 3, Decode Measurements, section 4). Be that as it may, both edges of the T1 sample, as well as both edges of each of the other three samples, T2, T3 and T4, are contained within the two edges of the reference distance (labeled p in the USS's).

In UPC, for example, one of the two reference edges is common with one edge of the two edges defining the sample half the time according to the primary Savir et al. decoding approach (please see their article, page 29, FIG. 12). One reference edge is the same edge as one edge for sample T1, but not so for sample T2 (T1 and T2 only are required to decode six UPC characters). Be that as it may, both edges of the T1 sample, as well as both edges of the T2 sample, are contained within the two edges of the reference distance (labeled T in their article).

In Table 1, the five quantities listed in column B, 100, 100, 200, 200, 200, represent the number of timing counts of five possible successive bar code elements from a BCB symbol. Table 2 lists the cumulative value of these same timing count quantities in column A, 100, 200, 400, 600 and 800. This relates to spreadsheet examples herein wherein column B lists individual element timing counts while column A lists them cumulatively. In explaining applicants' decoder operation, the timing count numbers used in Tables 1 and 2, an example of an element sequence in BCB, are pristine and reflect no distortions.

The four lower case letters in Tables 1 and 2, a, b, c and d, correspond to respective borders between elements, the edges. Edges a, b, c and d are the four edges used in the most fundamental operation described above. Edges a and b shown on the righthand side of the column are the two edges used to establish a reference distance with which the sample distance shown on the lefthand side of the column, defined by the two edges c and d, is then converted into modules, the integer module value. Sample edges c and d straddle reference edge b, separating sample distance c to d into two elements.

TABLE 1

Column B

_a
100
100
c_200
200_b
d_200

TABLE 2

Column A

_a
100
200
c_400
600_b
d_800

By way of illustration, if 6 modules minimum as described above were selected for the minimum decoder reference distance in modules, Tables 1 and 2 would represent the worst categorization case for applicants' decoder to resolve for their BCB symbology. This is because the 6 modules on the right are the least number any timing count reference distance error (due to edge noise, for example) would be "diluted" by division when calculating Z, and further because, the 4 modules on the left are the largest legal number of modules in a BCB sample distance, and that number, 4, would effectively "multiply" what error still exists after the righthand dilution of the error associated with the calculated reference, Z.

Reverse Processing to Double Output

Color errors or width errors may occur during the processing of individual edges of a signal from bar code symbol, for example, if severe defects or distortion has occurred. A color error occurs when one module is mistaken for the wrong color. A width error occurs when a module is inserted or removed changing the width of an adjacent module(s). One can imagine several black on one side, white on the other side one-module game type dominoes arranged vertically along a line: a color error mistakenly flips a domino and a width error mistakenly inserts or removes a domino.

If uncorrected, the best result from a color or width error would be a no-read from that scan. The directional nature of applicants' straddling decoder, however, allows two useful processings of the same set of scan data. With other decoders, processing in a forward or backward direction yields the identical result, good or bad. Applicants' reverse processing allows two, not just one, but two valuable decodes of each scan data set.

For example, if the mechanical scan rate of the Accu-Sort Incorporated, Telford, Pa., Model 20 scanner is 400 scans per second, using Cias' forward and reverse decoder processing technique would increase the scanner's effective scan rate to 800 scans per second, all else being equal.

The foundation for reverse processing is the straddling approach, because straddling makes applicants' decoder directional, more specifically, referring to Table 1 above, for example, edge d leads the other three edges as described, just as each additional edge encountered in turn below edge d would lead its three respective edges (additional edges are not shown in Table 1). Table 1 shows one operation cycle's worth of four edges arranged in two pairs of edges, one pair of two edges for the reference distance, a and b, and one pair of two other straddled-around-b edges, c and d, for the sample distance. Edges a, c and b will have already been processed (in that order) and edge d is the edge being processed, edge d is the "subject" edge of the cycle shown in Tables 1 and 2.

A reference Z calculated from the distance in modules between the pair of edges a and b is used to measure the distance in modules between the sample pair of edges c and d. As depicted in Table 1, the pair of edges, a and b, and the pair of edges, c and d, make up one operation cycle as described. As may be seen, the same four edges that comprises one operation cycle as described simply cannot be encountered if the direction of processing had been started from the other end of the symbol. That is why reverse processing works.

True, from the reverse processing direction, edges c and d will pair up again as a sample distance and edges c and d will again straddle edge b, but:

1) edge d would have been processed already and edge c would be the subject edge being processed,
2) the reference edge a could not possibly pair up with reference edge b, and,
3) if reference edge b tended in the first direction of processing to cause the local, Z, to be too large, in the second direction the opposite would be true.

Reverse processing can increase the output of a scanning system that utilizes applicants' decoder approaches.

More specifically, most rounding decision errors occur because the critical four edges involved in any one operation cycle as depicted in Table 1 conspire to cause a rounding decision error. For example, say the worst combination of four 16 tick errors occur in Table 1: a 16 tick error on edge a, a 16 tick error on edge b, a 16 tick error on edge c and a 16 tick error on edge d. If the edge errors on the two reference edges cause a and b to be perceived too far apart, 632 ticks instead of a correct 600 ticks as shown, and thus cause too-large a Z, 105.3 (632/6), instead of 100, with which to measure too small a sample between edges c and d, which, because of their respective 16 tick edge errors, are 368 ticks apart instead of 400 ticks, the operation looks like so (column D/column C=column E in the spreadsheet): 368/105.3=3.49.3.49, with no other help, is rounded to become 3 modules, a classic rounding decision error because the extent of the sample, c to d, is 4 modules wide, not 3.

A small improvement in any of edges a, b, c or d would avoid the rounding decision error and thus, typically, avoid a no read, "for want of a nail, . . . the entire scan was wasted." As described, a conspiracy of four edges, each with a relatively small edge error, arranged in a combination of two pairs, one reference edge pair and one sample edge pair, can readily cause of a rounding decision error, but, if the same scan data was processed in reverse order with applicants' directional straddling decoder, the same combination of two pairs cannot possibly occur and conspire to cause the same rounding decision error.

Reversing the processing direction of a bar coded representation of characters and processing the bar coded representation of characters a second time in the reversed direction is useful because it increases scanning system output by salvaging no-reads.

Computer simulation test analysis suggests that the second processing affords a similar opportunity to get a good reading as would another scan taken under similar conditions. Table 3 following shows the results of forward and reverse tests which were run under the following test conditions:

Six test runs, each with 50 scan data records, were made in Bcb Format B of the 16 digit message (145 modules including start/stop): 8890123456789099 All records were distorted with +0.40X ink spread (the maximum limit specified in the USS for Code 128 is: $t_b$=+ or −0.40X); the same set of randomly selected edge errors (systematic noise; seed=3977) from a uniform distribution, + or −0.24X, was added to each edge of all 50 records (equal to edge-to-edge error of, $t_e$=+ or −0.48X, 240% of the specified $t_e$ for Code 128).

Acceleration was used in the first four test runs (tests 32A, 32B, 33A and 33B) and acceleration changed the moving average module, Z, about 30% from end to end of each record. Applicants' directional decoder, with 6 to 9 modules (four or six elements) used to calculate Z on each line, with partial cooking set at threshold + or −0.20X, the damper set at + or −0.010X, and with the abridged 0X, 3X logic level set for 0.38 to 0.62 fractions, was used in all runs.

The results of processing in one direction only of all the test runs was a good read output of 48% to 72% (e.g., test 33A and 33C each produced 36 good reads out of 50, 72%). The result processing in both direction was from a good read output of 88% to 94%. Table 3 summarizes the no-read results; listed records are no-reads. The three good read totals include forward and reverse combined.

Software Voting

Reverse processing is an example of a second processing of scan data timing counts of a bar coded representation of characters to obtain another result. Various processing steps, for example, different processing steps to establish the local average in a different manner as described below, could also be used in a second processing to obtain a different result. Different specified processing parameters, for example, different threshold levels described below, could also be used in yet another processing to obtain yet another result. Two or more processings could produce two or more results. This is helpful to, for example, salvage a good read from a no-read, or to increase the confidence level in a good reading. The use of a different second processing to confirm a good read may be called software voting, in contrast to hardware voting that may be done by processing a new set of scan data from another scan.

The Damper

The damper is an approach that may be used to prevent the local average, Z, from varying more than a preselected amount from one categorization to the next (from one line of the spreadsheet to the next). For example, the damper may be set at the preselected amount of + or −0.010X (1%) so that the established reference distance, Z, used to measure sample distance separations between similar edges, is dampened and thus limits the (maximum) amount of change allowed in the established reference distance to one percent from one sample distance categorization to the next (this was the damper setting used in all test runs summarized in Table 3).

TABLE 3

| Record #s below: | test 32A forward | test 32B reverse | test 33A forward | test 33B reverse | test 33C forward | test 33D reverse |
|---|---|---|---|---|---|---|
| No-reads: | 20 | 15 | 14 | 26 | 14 | 16 |
| Overlaps: | 3 | | 6 | | 6 | |
| Good reads: | 47 (94%) | | 44 (88%) | | 44 (88%) | |
| 1 | | | 1 | | | 1 |
| 2 | | 2 | 2 | | 2 | |
| 3 | | | 3 | 3 | | 3 |
| 4 | 4 | | | 4 | | |
| 5 | 5 | | | | 5 | |
| 6 | | 6 | 6 | | 6 | 6 |
| 7 | | 7 | | | | 7 |
| 8 | | | 8 | 8 | | |
| 9 | | | | 9 | 9 | |
| 10 | 10 | | | 10 | 10 | 10 |
| 11 | | | | | | |
| 12 | 12 | | | | | |
| 13 | | 13 | | 13 | | 13 |
| 14 | 14 | | 14 | | | |
| 15 | | 15 | | 15 | | 15 |
| 16 | 16 | | | 16 | | 16 |
| 17 | | | | | | |
| 18 | 18 | 18 | | 18 | 18 | 18 |
| 19 | 19 | 19 | | | | |
| 20 | | | | | | |
| 21 | 21 | | | 21 | 21 | 21 |
| 22 | 22 | | | | | |
| 23 | 23 | 23 | 23 | | | 23 |
| 24 | 24 | | | 24 | 24 | |
| 25 | 25 | | | 25 | 25 | 25 |
| 26 | | | | | 26 | |
| 27 | | 27 | | 27 | 27 | 27 |
| 28 | | | | 28 | | |
| 29 | | | | 29 | | |
| 30 | | 30 | 30 | | | 30 |
| 31 | 31 | | 31 | 31 | | 31 |
| 32 | | | | 32 | | |
| 33 | | | | 33 | | |
| 34 | 34 | | | 34 | 34 | |
| 35 | 35 | | | 35 | | |
| 36 | 36 | | 36 | 36 | 36 | |
| 37 | | | | | | |
| 38 | | | | 38 | | |
| 39 | | | 39 | | | 39 |
| 40 | | 40 | | | | |
| 41 | 41 | | | 41 | 41 | |
| 42 | 42 | | | | | |
| 43 | | | | | | |
| 44 | | 44 | | | | |
| 45 | | 45 | | | 45 | |
| 46 | | | | | | |
| 47 | | | 47 | 47 | | |
| 48 | | | | 48 | | |
| 49 | | | 49 | 49 | | |
| 50 | 50 | | | | 50 | |

Detecting Errors

Applicants' directional straddling decoder with, for example, their BCB symbology, has a capacity to correct errors during processing (e.g., cooking and logic) and after processing (e.g., parity and edac, a Hamming code, see applicants' prior application). Reverse processing is its own kind of error correcting device. In practice, certain techniques aid in the expeditious deployment of reverse processing in order to salvage a scan that would or may otherwise be wasted.

If the collective error correcting capacity of a given decoding system were exceeded, reverse processing should be initiated as soon as possible. Why process the balance of the scan data if it can be detected that the scan will or should become a no-read anyway? Not only is time wasted but it may also be possible that a misread could result.

For efficiency and safety sake for example, if an error is detected but is not corrected during edge processing and is not correctable after processing with the available means, or if more errors have occurred than the number of errors that are correctable, processing should be stopped as soon as possible and restarted, but in the reverse direction. Or, for example, if one type of error is more hazardous to correct than others, processing may be stopped as soon as this type of error is detected (and restarted in the reverse direction). Something is needed to trigger reversing as described, some means with which to detect and count various corrected and uncorrected errors and to count them as they occur.

If processing has already been reversed, and if it can be detected that the second (reverse) processing will or should become a no-read, processing should be stopped immediately. But applicants do not necessarily say die. It may be possible to use another embodiment of their decoder, or the same with different settings or thresholds, and so forth.

One way of detecting errors in an (n, k) code during processing, such as UPC for example, is to determine if the number of modules in each codeword (comprised of four elements in UPC) is seven; more or less than seven indicate a width error has occurred. If no correcting means are available, processing should immediately be reversed. If processing has already been reversed, start another decoder approach or generate a no-read.

One way of detecting errors during processing of various bar codes is to detect elements with illegal widths. In all bar codes, a width of 0X is illegal. An element with 0X width occurs in the spreadsheet operation column G, for example, if a sample pair of elements each 1X wide is rounded to 1X instead of 2X; if the next element is also 1X, it may also be mistaken, it may become 2X wide.

If rounding decision errors are made, 2X elements may be mistaken for 3X, for example. In BCB it is obvious to detect elements with illegal widths of 3X since only 1X and 2X widths are legal; if a 3X is entered into column G, it is illegal. In a more limited way, an illegal 3X can be detected in UPC, for example, if the first two elements of a UPC character total 4X, neither of the other two can legally be 3X since together they must total 3X. Further for example, if the first two elements of a UPC character total 5X, neither of the other two can be 2X.

With BCB, illegal 2X elements may also be detected; not all 2X elements are necessarily legal. The first module of all legal 2x elements must be odd. Referring to FIG. 1, the first data element immediately past the star shown in each end pattern is the first (odd) numbered module for this purpose. This works because in valid BCB data, between BCB's ending patterns, there are an equal number of white to black modules arranged so that the number of modules of one color does not exceed the other by more than one, and so that 2X elements alternate in color because an even number of 1X element must separate 2X elements. All legal 2X data elements in BCB must begin on an odd numbered module, and therefore any 2X element that begins on an even numbered module must be illegal.

In BCB, illegal 2x elements may be detected by tracking during spreadsheet operation, for example, whether the module count is odd or even with a flag. The use of a flag and a counter during decoder edge processing may be used to: 1) the on/off module flag keeps track of an odd or even module count so that illegal 2x elements may be detected, and (2) the counter keeps track of the number of detected but uncorrected errors so that, if processing has already been reversed, another decoder's processing can be started or a no-read can be generated, without delay, if the error correcting capacity has been exceeded, or processing can be reversed if it has not already been.

Detecting errors, as well as correcting errors through symbology dependent logic, is described further below, but cooking is discussed first because cooking supports logic correcting.

Cooking, Individual Edge Corrections

If an individual edge appears mislocated during the processing operation beyond a selected amount (for example, more than 0.20X), it may be corrected by a process applicants call "cooking." The cooking process subtracts ticks from the element on one side of a mislocated edge and adds this same number of ticks to the element on the other side of that mislocated edge. Edge error reduction corrections can increase scanning system output productivity. Various reasons for cooking include: 1) to make subsequent Z calculations more accurate, since a mislocated edge can corrupt calculations to establish subsequent Zes, 2) to make a subsequent sample measurement with an operational Z more accurate, since a mislocated edge (top) sample can corrupt a sample distance, and 3) to provide means for logic rounding decisions to be implemented so that rounding decision mistakes can be avoided (described below).

Cooking limits edge error peaks or spikes and works as follows, assuming the (selectable) threshold, $t_t$, that triggers the cooking error reduction operation is set at ±0.20X: As each edge is processed in turn, it is partially corrected if it is more than 0.20X from where Z places it. These edge error reduction corrections increase output because each edge in turn influences the accuracy of calculations for two (or possibly more) Zes and a bad Z could cause a bad rounding decision, and further, each edge becomes the (top) end edge defining a sample distance pair of elements that includes one undecoded element, and a rounding decision must be made for that sample pair in turn.

For example, say for convenience in this example of decoding operation, the reference Z has been determined to be 100 ticks, and the sample pair of elements to be rounded into modules measures 325 ticks cumulatively, 100 ticks and 225 ticks respectively for the elements, and the outside edge of the 225 tick element is the edge being scrutinized and rounded. This is how Z places the scrutinized edge: 325/100=3.25 (as shown on the spreadsheets, for example, column C/column D=E'; column E'=before cooking, and column E=after the cooking correction). The fractional portion, 0.25, reflects the (therefore assumed) amount of scrutinized edge mislocation of 25 ticks in this example. And because the fraction portion, 0.25, is 0.05 greater than the selected threshold level of 0.20X, "partial" cooking is started and works as follows.

First, five ticks are subtracted from the 225 tick element making it 220 ticks (this reduces the apparent error to a fractional portion of 0.20, the selected threshold like so: 100+220=320; 320/100=3.20 in column E; fractional portion 0.20=$t_t$). Second, five ticks are added to the element on the other side of this now corrected scrutinized edge. In this example, the sample pair of elements is rounded to 3 modules.

As may be understood, in similar fashion, a fractional portion of 0.75 would work as follows: five ticks are added to the subject element and five ticks are subtracted from the element on the other side of the scrutinized edge being corrected.

"Full" cooking, for example, is one variation of individual edge correction via cooking. Continuing with the same example, if full cooking were selected with the threshold, $t_r$, that triggers cooking set at ±0.20X, a fractional portion of 0.25 (since it exceeds 0.20) would be handled as follows: 25 ticks are subtracted from the 225 tick element making it 200 ticks and 25 ticks are added to the element on the other side of the corrected scrutinized edge. In this manner, the fractional portion is reduced to zero by full cooking at a selected threshold level.

Full cooking may also be used with a threshold level to trigger cooking set at zero ($t_r$=0), in which case all fractions are reduced to zero via cooking, that is, full cooking is used on all lines that do not in the first instance (column E') work out to a whole integer.

The number of modules in a sample is, in effect, a multiplier by which any error that happens to be in the local, Z, is multiplied. Therefore, the threshold level at which cooking is initiated (the fractional portion in column E'), and/or, the level to which cooking is performed (the fractional portion in column E), may be increased, for example, in proportion to the number of modules in a sample distance (the rounded integer of column E'). For example, a higher cooking level may automatically be used for sample distances of 4 modules compared to a sample distance of 3 modules, etc.

The level at which cooking is initiated, as well as the level to which cooking is performed, may be varied for reasons mentioned above, as well as for reasons to do with the implementation of self-correcting logic, for example, which is described below. (Also, please see custom cooking recipes, below.)

Tables 1 & 2 are repeated for convenience with Tables 4 to 8 which follow. The four edges, a, b, c and d, and the circumstances shown in Tables 1 & 2 correspond to Tables 4 to 8. Table 4 shows the 16 possible combinations and results of four 0.20X errors before and after cooking on a (worst case) decision set (one operation cycle) of 4 edges, a, b, c and d, in a sequence of BCB elements. Tables 5 to 8 show the 8 possible combinations and results of three 0.20X errors before and after cooking on this same decision set of 4 edges, a, b, c and d in this sequence of BCB elements.

The capital letter column heads in Tables 4 to 8 correspond directly to spreadsheet column heads. Column C' contains the measure of the reference distance in ticks. Column C contains the measure of the sample distance of one pair of elements in ticks. Column D contains the local average, Z, in ticks, calculated in this example as follows: column C'/6. Column E' contains the result of column C/column D before cooking. Column E contains the result of column C/column D after edge d has been cooked.

The first four lower case column letters, a, b, c and d, in Tables 4 to 8 represent the edges that correspond to the similarly lettered edges shown in Tables 1 & 2 and form a worst case BCB decision set for one operation cycle as described. A + or − sign in these columns indicates that the respective edge had a 20 tick error, effectively moving that respective edge 20 ticks in column A' of the spreadsheet; A zero in these columns indicates that that edge has no error (Tables 5 to 8). A + sign in these columns indicates that 20 ticks effectively was added to column A' and a − sign in these columns indicates that 20 ticks effectively was subtracted from column A' of the spreadsheet. In Table 4, all four edges have a 20 tick error while in Tables 5 to 8 only three edges have a 20 tick error.

The column headed d' contains the number of ticks that edge d was moved on each line as a result of cooking at the selected threshold level of + or −0.20X (nc=no change); a plus sign indicates that that number of ticks was added to the subject element (between edges b and d shown in Tables 1 & 2) and subtracted from the next element (not shown), while the minus sign in column d' indicates that that number of ticks was subtracted from the subject element and added to the next element (not shown).

The last column, the column labeled b/w, indicates whether the cooking edge correction to edge d was an improvement (b=better), that is, did edge d get moved in the direction that reduced the amount of edge error reflected in column d, or, whether the cooking edge correction to edge d made things worse (w=worse), that is, did edge d get moved further in the (wrong) direction of the edge error reflected in column d, while nc=no change. A 3 or 5 in the b/w column indicates a rounding decision error (due to the conspiracy of the four edges, not cooking), 3 if it was rounded to 3 instead of 4 which is correct, and 5 if it was rounded to 5.

TABLE 1

| Column B |
|---|
| _a |
| 100 |
| 100 |
| c_200 |
| 200_b |
| d_200 |

TABLE 2

| Column A |
|---|
| _a |
| 100 |
| 200 |
| c_400 |
| 600_b |
| d_800 |

TABLE 4

BCB Cooking on Edge d

| a | b | C' | c | d | C | D | E' | E | d' | b/w |
|---|---|---|---|---|---|---|---|---|---|---|
| − | − | 600 | − | − | 400 | 100.0 | 4.00 | 4.00 | nc | nc |
| − | − | 600 | − | + | 440 | 100.0 | 4.40 | 4.20 | −20 | b |
| − | − | 600 | + | − | 360 | 100.0 | 3.60 | 3.80 | +20 | b |
| − | − | 600 | + | + | 400 | 100.0 | 4.00 | 4.00 | nc | nc |
| − | + | 640 | − | − | 400 | 106.7 | 3.75 | 3.80 | +5 | b |
| − | + | 640 | − | + | 440 | 106.7 | 4.12 | 4.12 | nc | nc |
| − | + | 640 | + | − | 360 | 106.7 | 3.37 | 3.20 | −17 | 3 |
| − | + | 640 | + | + | 400 | 106.7 | 3.75 | 3.80 | +5 | w |
| + | − | 560 | − | − | 400 | 93.3 | 4.29 | 4.20 | −9 | w |
| + | − | 560 | − | + | 440 | 93.3 | 4.71 | 4.80 | +9 | 5 |
| + | − | 560 | + | − | 360 | 93.3 | 3.86 | 3.86 | nc | nc |
| + | − | 560 | + | + | 400 | 93.3 | 4.29 | 4.20 | −9 | b |
| + | + | 600 | − | − | 400 | 100.0 | 4.00 | 4.00 | nc | nc |
| + | + | 600 | − | + | 440 | 100.0 | 4.40 | 4.20 | −20 | b |
| + | + | 600 | + | − | 360 | 100.0 | 3.60 | 3.80 | +20 | b |
| + | + | 600 | + | + | 400 | 100.0 | 4.00 | 4.00 | nc | nc |

TABLE 5

BCB Cooking on Edge d

| a | b | C' | c | d | C | D | E' | E | d' | b/w |
|---|---|---|---|---|---|---|---|---|---|---|
| 0 | − | 580 | − | − | 400 | 96.67 | 4.14 | 4.14 | nc | nc |
| 0 | − | 580 | − | + | 440 | 96.67 | 4.55 | 4.80 | +25 | 5 |
| 0 | − | 580 | + | − | 360 | 96.67 | 3.72 | 3.80 | +8 | b |
| 0 | − | 580 | + | + | 400 | 96.67 | 4.14 | 4.14 | nc | nc |
| 0 | + | 620 | − | − | 400 | 103.33 | 3.87 | 3.87 | nc | nc |
| 0 | + | 620 | − | + | 440 | 103.33 | 4.26 | 4.20 | −6 | b |
| 0 | + | 620 | + | − | 360 | 103.33 | 3.48 | 3.20 | −28 | 3 |
| 0 | + | 620 | + | + | 400 | 103.33 | 3.87 | 3.87 | nc | nc |

TABLE 6

BCB Cooking on Edge d

| a | b | C' | c | d | C | D | E' | E | d' | b/w |
|---|---|---|---|---|---|---|---|---|---|---|
| − | 0 | 620 | − | − | 400 | 103.33 | 3.87 | 3.87 | nc | nc |
| − | 0 | 620 | − | + | 440 | 103.33 | 4.26 | 4.20 | −6 | b |
| − | 0 | 620 | + | − | 360 | 103.33 | 3.48 | 3.20 | −28 | 3 |
| − | 0 | 620 | + | + | 400 | 103.33 | 3.87 | 3.87 | nc | nc |
| + | 0 | 580 | − | − | 400 | 96.67 | 4.14 | 4.14 | nc | nc |
| + | 0 | 580 | − | + | 440 | 96.67 | 4.55 | 4.80 | +25 | 5 |
| + | 0 | 580 | + | − | 360 | 96.67 | 3.72 | 3.80 | +8 | b |
| + | 0 | 580 | + | + | 400 | 96.67 | 4.14 | 4.14 | nc | nc |

TABLE 7

BCB Cooking on Edge d

| a | b | C' | c | d | C | D | E' | E | d' | b/w |
|---|---|---|---|---|---|---|---|---|---|---|
| − | − | 600 | 0 | − | 380 | 100.0 | 3.80 | 3.80 | nc | nc |
| − | − | 600 | 0 | + | 420 | 100.0 | 4.20 | 4.20 | nc | nc |
| − | + | 640 | 0 | − | 380 | 106.7 | 3.56 | 3.80 | +24 | b |
| − | + | 640 | 0 | + | 420 | 106.7 | 3.94 | 3.94 | nc | nc |
| + | − | 560 | 0 | − | 380 | 93.3 | 4.07 | 4.07 | nc | nc |
| + | − | 560 | 0 | + | 420 | 93.3 | 4.50 | 4.80 | +30 | 5 |
| + | + | 600 | 0 | − | 380 | 100.0 | 3.80 | 3.80 | nc | nc |
| + | + | 600 | 0 | + | 420 | 100.0 | 4.20 | 4.20 | nc | nc |

TABLE 8

BCB Cooking on Edge d

| a | b | C' | c | d | C | D | E' | E | d' | b/w |
|---|---|---|---|---|---|---|---|---|---|---|
| − | − | 600 | − | 0 | 420 | 100.0 | 4.20 | 4.20 | nc | nc |
| − | − | 600 | + | 0 | 380 | 100.0 | 3.80 | 3.80 | nc | nc |
| − | + | 640 | − | 0 | 420 | 106.7 | 3.94 | 3.94 | nc | nc |
| − | + | 640 | + | 0 | 380 | 106.7 | 3.56 | 3.80 | +24 | w |
| + | − | 560 | − | 0 | 420 | 93.3 | 4.50 | 4.80 | +30 | 5 |
| + | − | 560 | + | 0 | 380 | 93.3 | 4.07 | 4.07 | nc | nc |
| + | + | 600 | − | 0 | 420 | 100.0 | 4.20 | 4.20 | nc | nc |
| + | + | 600 | + | 0 | 380 | 100.0 | 3.80 | 3.80 | nc | nc |

BCB Fractional Logic

BCB self-correcting logic is based on its 1X, 2X structure as processed in applicant's decoder. Each different symbology has its own logic according to the particular codes' conventions and structure. Popular (n, k) bar codes, for example, allow width errors to be readily detected on a character by character basis. Applicants believe that BCB's logic is most encompassing, however. BCB's characters are coded according to its particular bar code convention which includes extensive logic structure, for example, BCB 1X and 2x alternating structure. BCB avoids possible categorizing errors based on its particular logic structure. Different types of BCB logic are described below in operation in the spreadsheet by way of examples.

Self-correcting logic in BCB increases the number of good outputs by avoiding element widths of 0X, 3X and illegal 2X. Fractional logic depends in part on cooking. This form of logic correcting is comparatively abridged compared to integer logic correcting explained further below. Fractional logic works as follows:

To avoid 0X elements, when cooking is called for on a line where the rounding decision fraction (e.g., the spreadsheet column E' fraction) is between 0.30 and 0.49, do not round down if 0X would result (e.g., in column G of the spreadsheet); instead round up.

To avoid 3X elements, when cooking is called for on a line where the rounding decision fraction is between 0.50 and 0.70, do not round up if 3X would result; instead round down.

To avoid illegal 2X elements (illegal 2X elements begin on an even numbered module and come from 1X elements), when cooking is called for on a line where the rounding decision fraction is between 0.50 and 0.70, do not round up if an illegal 2X would result; instead round down.

By using levels such as above (0.30 and 0.70) for fractional logic correcting, elements hit with (about) a 1X spike edge error, for example, may be readily corrected by the error control positions (edac, as described elsewhere). If a spot spike edge error of about 1X appears on a 1X bar in BCB, for example, and obliterates about half of a neighboring 2X space, an illegal 2X bar will result. This illegal 2X bar is called an erasure error because the location of the error is apparent: a black,black is located in a BCB digit position instead of one black and one white module. One black module of the illegal 2X bar should be changed to a white module, but which one?

Under these circumstances, fractional logic correcting is not a good bet, since correcting either black module (to white) of the illegal 2X bar element would appear to be a correct correction during edge processing; if the wrong decision is made, a BCB switch error results (in BCB, a switch error occurs when both modules of a BCB digit reverse and thus create the other BCB digit in error). A BCB switch error is a worse condition than the erasure error that existed before the incorrect logic rounding correction. Two modules have to be changed to correct a switch error (only one module has to be changed to correct an erasure error). Fewer switch errors can be dealt with by edac than can erasure errors.

There is an example of fractional logic correcting that may be found in Table 5 above, on the second line, because the E' fraction is 0.55, but rounding E', 4.55, up under the described circumstances would produce an (illegal) 3X element, for example, in column G of the spreadsheet (not shown in Table 5). To avoid the illegal 3X element, do not round E', 4.55, up, instead round down.

BCB Integer Logic

BCB integer self-correcting logic is more powerful because prior and subsequent rounding decision implications are brought to bear. By way of example, columns E and G in three consecutive lines of the spreadsheet are discussed below in the integer logic outline: the "previous" line, the "current" line and the "next" line:

I. If you get a 0X element in the current (column) G:
   A. check previous G:
      1. if previous G is 1X, go back and round current E up 1 and continue normal processing from the current E (making the current G 1X and taking 1X from the next G).
      2. For explanation purposes, take no action: if previous G is an illegal 2X, the 0X will have been corrected already; see Step II which covers illegal 2X elements followed by a 0X.
      3. if previous G is a legal 2X, continue processing up to the next G:
         a. if next G is 1X, go back and round previous E down 1 and continue normal processing from the previous E (making the previous G 1X and the current G 1X).
         b. if next G is 4X, round the current G up 2 and continue normal processing from the current G (making the current G 2X and the next G 2X).
         c. if next G is 2X (a 2X will appear legal since the previous G is 2X and the current G is 0X), leave the 0X in the current G and give up: increment the uncorrected-by-Bcb error counter by one; check error count; if the count exceeds the set level of edac correction, stop processing, generate no-read. If the count does not exceed the set edac level, continue processing from the next G which is 2X and has already been calculated.
II. When a 2X element is entered into current G, check whether the module count flag is off for even which is illegal or on for odd which is legal:
   A. if the flag is on, the 2X is legal; assume it is also correct and continue normal processing.
   B. if the flag is off, the 2X is illegal; continue processing up to the next G:
      1. if the next G is 0X, go back and round the current E down 1 and continue normal processing from the current E (making the current G 1X and the next G 1X).
      2. If the next G is not 0X, leave the illegal 2X in the current G and give up: increment the uncorrected-by-Bcb error counter by one; check error count; if the count exceeds the set level of edac correction, stop processing, generate no-read. If the count does not exceed the set edac level, continue processing from the next G.
III. If you get a 3X element in the current G:
   A. check previous G:
      1. if previous G is 2X, go back and round current E down 1 and continue normal processing from the current E (making the current G 2X and adding 1X to the next G).
      2. if previous G is 1X, continue processing up to the next G:
         a. if next G is 0X, go back and round current E down 1 and continue normal processing from the current E (making the current G 2X and the next G 1X).
         b. if next G is 2X, go back and round previous E up 1 and continue normal processing from the previous E (making the previous G 2X and current G 2X).
         c. if next G is 1X, leave the 3X in the current G and give up: increment the uncorrected-by-Bcb error counter by one; check error count; if the count exceeds the set level of edac correction, stop processing, generate no-read. If the count does not exceed the set edac level, continue processing from the next G which is 1X and has already been calculated.
IV. If you get a 4X in the current G followed by a 0X in the next G, round the current G down 2 and continue normal processing (making the current G 2X and the next G 2X).
   If you get a 4X not followed by a 0X in the next G, leave the 4X in the current G and give up: increment the uncorrected-by-Bcb error counter by one; check error count; if the count exceeds the set level of edac, stop processing, generate no-read. If the count does not exceed the set edac level, continue processing from the next G.
V. If you get a 5X or a 6X in current G, leave it in the current G and give up: increment the uncorrected-by-Bcb error counter by two; check error count; if the count exceeds the set level of edac correction, stop processing, generate no-read. If the count does not exceed the set edac level, continue normal processing.
VI. If you get greater than 6X in current G, stop processing, generate no-read.

There is an example of integer logic correcting that may be found in Table 4 above, on the tenth line, because the E' fraction is 0.71, but rounding E' up under the described circumstances would produce an (illegal) 3X element, for example, in column G of the spreadsheet (not shown in Table 4). To avoid the illegal 3X element in this example where the previous column G is 2X, do not round E' up, instead round down according to the integer logic outline, part III, A, 1, above.

Because the E' fraction is 0.71, the fractional logic described previously would not have corrected this error; integer logic as described is more powerful because it avoided the rounding decision error. Still referring to Table 4, tenth line, if E' is rounded down from 4.71 according to integer correcting logic to 4.20 via the cooking threshold as described, 51 ticks would be cooked, more than offsetting the original 20 tick edge error on edge d, 31 ticks more in fact, 31 ticks too much. This is partially because the local average, Z, in column D was too small, an example of how ticks can be artificially manufactured in error if Z is too small, creating the (ill) effect of a partial width error. Another reason for the 31 tick overkill is that the sample distance of the example (tenth line of Table 4) was 40 ticks off, 440 instead of 400 (40 plus the 31 tick overkill adds up to the ticks represented in the original E' fraction, 71 ticks).

One reason to set the cooking threshold level higher rather than lower is to allow for artificially manufactured ticks to "slip" through because the Z is too small (similarly, artificially removed ticks are allowed for if Z is too large).

However, the error correcting battle was won, the rounding decision error was avoided, and probably the 31 tick overkill will not cause a rounding decision error (31 ticks represent only 31% of X in this example, less than half a module). But it is more clear than ever that the most accurate local average possible is highly desirable. Before more accurate ways to figure Z are described, the effect of applicants' decoder structure, cooking and logic are described in stages via bar code computer simulation tests described below.

Computer Bar Code Simulations

Applicants designed and wrote a bar code simulation program for IBM PC compatible computers which can create and distort, and then can run decode tests on BCB and UPC bar code timing count scan data records automatically. Numerous bar code experts who have seen this program (under confidentiality agreements) have said this comprehensive program is the first of its kind and a rather useful bar code testbench. Although the program is not yet complete and has bugs, the program is already able to provide valuable insights into bar code decoding.

For example, with this program, a researcher can already key in bar code test parameters regarding: which symbology to test; which decode algorithm system (for the specified symbology) to test; input (message(s) to be tested); timing counts per module (starting) basis; ink spread; noise; spike; and, acceleration, and more. Amplitude of error, frequency of occurrence, the nature of the random distribution of errors and other parameters are selectable in various terms. Various computer files are made to store scan data timing count records with different stages of distortion. After the specified levels of various distortions are achieved, the respective scan data record files are ready for decode simulation test runs (also, please see Appendix D which describes applicants' computerized bar code testbench system in detail).

Once completed, applicants bar code test bench program may be used to compare different symbologies, mean time between failure data can be compiled, various decode algorithm systems may be developed and perfected, all for the first time; these things have not yet been done in any meaningful way for bar codes. Applicants believe that bar codes are how most numbers will be fed into our machines in the next century, and our machines' appetites have only just been wetted.

Tables 9 & 10 following each show the results of five BCB bar code test runs. Each test run included 50 scan data records of BCB Format B of the 16 digit message (145 modules including start/stop): 8890123456789099. Applicants decoder system was used as described below.

All records in Table 9 were distorted with +0.40X ink spread. The maximum specified limit of ink spread, $t_b$, for Code 128 is ±0.40X (please see AIM's USS for Code 128 which provides some comparison basis). All records in Table 10 were distorted with +0.52X ink spread. Other parameters for the five test runs were similar as described below. A similar set of tests was also run at 0% ink spread as a (further) control (not shown). Since the results are comparable no matter the level of ink spread (0%, 40% and 52%), the conclusion regarding ink spread is that ink spread has no noticeable effect on applicants' new edge-to-edge decoder systems.

Systematic noise was added to each record as follows. The same set of randomly selected edge errors (seed for tests 34=3977, seed for tests 35=2654) from an essentially uniform distribution, ±0.24X, was added to each edge of all records in Tables 9 & 10. This level is equal to edge-to-similar-edge error of, $t_e$=±0.48X, which is 240% of the maximum specified $t_e$ for Code 128.

The acceleration or deceleration level changed the local average, Z, about 30% from end to end of each record.

BCB decode algorithm #3, which is defined by the fact that 6 to 9 modules, from 2 (if possible) or 3 pairs of elements, are used as the denominator to calculate Z for each line, was used to decode all records in Tables 9 & 10. BCB decode algorithm #2 is defined by the fact that 2 pairs of elements (from 4 to 8 modules) are used as the denominator to calculate Z for each line, and BCB decode algorithm #1 is defined by the fact that only 1 pair of elements (2 to 4 modules) are used as the denominator to calculate Z for each line.

Cooking levels (when used) were set at threshold, $t_r$=±0.20X, this was the level that initiated cooking as well as the level to which cooking was performed. Tests 34P, 35P, 34L and 35L are exceptions: in the P tests $t_r$=±0.15X, and in the L tests $t_r$=±0.10X. These P and L tests show the different results of different levels of cooking. Using different specified processing threshold parameters can be used to process the same scan data a second time to get another result which could be used, for example, to confirm a good reading. This is an example of software voting.

The fractional (abridged) logic level (when used) was set for 0.3 to 0.7 fractions. Use of a different fractional logic level, or not using this logic at all, for a different processing of the same scan data to get another result is another example of possible software voting.

Still referring to Tables 9 & 10, the first column in each table labeled "a" shows the results of the decoder as described but without cooking correcting and without logic correcting. If bar codes like UPC and Code 128, for example, were able to cope with high ink spread, which they cannot, it is believed that they would perform similarly, at least in the same ball-park range, to the first column "a" results, 4% to 8% good read output.

The second column in each table labeled "a+b" shows the results with the added benefit of cooking (but no logic). Output over column a improves by 250% (Table 10) to 500% (Table 9) as shown.

The third column in each table labeled "a+b+c" shows the results with the further added benefit of fractional logic. Output improves over column a+b by 330% (Table 9) to 350% (Table 10) as shown.

As shown, the benefits of cooking correcting and fractional logic correcting improves output in Table 9 by 1650%, from 2 to 33 reads, and in Table 10 by 875%, from 4 to 35 reads.

Tables 9 & 10 summarizes these results; listed records are no-reads.

Most of the remaining no-reads would also be corrected and become good BCB reads either by reverse processing or edac, not tested in Tables' 9 & 10 test runs.

These are the five primary systems of error correcting built into applicants' bar code decoder which work 100% with BCB:

a: new decode algorithm
b: cooking
c: logic
d: reverse processing, and
e: edac

Applicants' decoder systems also work well with other bar codes, especially UPC because of its previous decoder's shortcomings, but within limits. For example, other linear bar codes do not have edac incorporated into their structure. BCB avoids more rounding decision errors that kill good readings because BCB has more inherent logic correcting structure than other codes. All else being equal, (n, k)

codewords with more elements rather than fewer have less inherent logic structure than other codes. And of course, bar codes with element widths greater than 2X wide are handicapped because errors in the local calculation for Z are magnified that much more when the sample distance is converted to integer modules using Z.

Please see Appendix B filed herewith in support hereof, which contains sample spreadsheet page examples from test runs summarized in Tables 9 & 10. Reference page 24, from test run 35J, contains no random edge error distortion.

TABLE 9

| | a: | a + b: | | a + b + c: | |
|---|---|---|---|---|---|
| test: | 34M | 34G | 34J | 34P | 34L |
| cooking: | no | yes.20 | yes.20 | yes.15 | yes.10 |
| BCB logic: | no | no | yes | yes | yes |
| output: | 2 | 10 | 33 | 33 | 38 |
| percentage: | 4% | 20% | 66% | 66% | 76% |
| no-reads: | 48 | 40 | 17 | 17 | 12 |
| percentage: | 96% | 80% | 34% | 34% | 24% |
| 1 | 1 | | | | |
| 2 | 2 | 2 | 2 | | |
| 3 | 3 | 3 | 3 | 3 | 3 |
| 4 | 4 | | | | |
| 5 | 5 | 5 | 5 | | |
| 6 | 6 | 6 | 6 | 6 | |
| 7 | 7 | 7 | | 7 | 7 |
| 8 | 8 | 8 | | | |
| 9 | 9 | 9 | 9 | 9 | |
| 10 | 10 | 10 | 10 | 10 | |
| 11 | 11 | 11 | | | |
| 12 | 12 | 12 | | | |
| 13 | 13 | 13 | | | |
| 14 | 14 | 14 | 14 | | |
| 15 | 15 | 15 | | | |
| 16 | 16 | 16 | 16 | 16 | |
| 17 | 17 | 17 | | | |
| 18 | 18 | 18 | | | |
| 19 | 19 | 19 | | | |
| 20 | 20 | | | | |
| 21 | 21 | | | | 21 |
| 22 | 22 | 22 | | | |
| 23 | 23 | | | | |
| 24 | 24 | 24 | | | |
| 25 | 25 | 25 | 25 | 25 | |
| 26 | 26 | 26 | | 26 | 26 |
| 27 | 27 | 27 | 27 | 27 | 27 |
| 28 | 28 | | | | |
| 29 | 29 | 29 | 29 | 29 | |
| 30 | 30 | 30 | 30 | 30 | |
| 31 | 31 | 31 | | | |
| 32 | 32 | 32 | | | |
| 33 | 33 | 33 | | | |
| 34 | 34 | 34 | | | |
| 35 | 35 | 35 | | | 35 |
| 36 | 36 | 36 | 36 | 36 | 36 |
| 37 | 37 | 37 | | | |
| 38 | | | | 38 | 38 |
| 39 | 39 | 39 | | | |
| 40 | 40 | 40 | | | |
| 41 | 41 | 41 | 41 | 41 | 41 |
| 42 | 42 | 42 | | | |
| 43 | 43 | 43 | | | |
| 44 | 44 | | | 44 | 44 |
| 45 | 45 | 45 | 45 | | |
| 46 | | | | | |
| 47 | 47 | 47 | 47 | 47 | 47 |
| 48 | 48 | 48 | | | |
| 49 | 49 | | | | |
| 50 | 50 | 50 | 50 | 50 | 50 |

TABLE 10

| | a: | a + b: | | a + b + c: | |
|---|---|---|---|---|---|
| test: | 35M | 35G | 35J | 35P | 35L |
| cooking: | no | yes.20 | yes.20 | yes.15 | yes.10 |
| BCB logic: | no | no | yes | yes | yes |
| output: | 4 | 10 | 35 | 35 | 36 |
| percentage: | 8% | 20% | 70% | 70% | 72% |
| no-reads: | 46 | 40 | 15 | 15 | 14 |
| percentage: | 92% | 80% | 30% | 30% | 28% |
| 1 | 1 | | | | |
| 2 | 2 | 2 | | | |
| 3 | | | | | |
| 4 | 4 | 4 | 4 | 4 | 4 |
| 5 | 5 | | | | |
| 6 | 6 | | | | |
| 7 | 7 | 7 | 7 | 7 | 7 |
| 8 | 8 | 8 | 8 | 8 | |
| 9 | 9 | 9 | | | |
| 10 | 10 | 10 | | | |
| 11 | 11 | 11 | | | |
| 12 | 12 | | | | |
| 13 | | 13 | | | |
| 14 | 14 | 14 | | 14 | |
| 15 | 15 | 15 | 15 | | |
| 16 | 16 | 16 | | | |
| 17 | 17 | 17 | 17 | 17 | 17 |
| 18 | | 18 | | | |
| 19 | 19 | 19 | | | |
| 20 | 20 | 20 | 20 | | |
| 21 | 21 | 21 | 21 | 21 | 21 |
| 22 | 22 | 22 | 22 | 22 | 22 |
| 23 | 23 | 23 | 23 | 23 | 23 |
| 24 | 24 | | | | |
| 25 | 25 | | | | |
| 26 | 26 | 26 | | | |
| 27 | 27 | 27 | 27 | 27 | 27 |
| 28 | 28 | 28 | 28 | 28 | |
| 29 | 29 | | | | |
| 30 | 30 | 30 | | | |
| 31 | 31 | 31 | | 31 | 31 |
| 32 | 32 | 32 | | | |
| 33 | | | | | |
| 34 | 34 | 34 | | | |
| 35 | 35 | 35 | 35 | 35 | |
| 36 | 36 | 36 | 36 | 36 | |
| 37 | 37 | 37 | | | |
| 38 | 38 | 38 | | | |
| 39 | 39 | 39 | | | 39 |
| 40 | 40 | 40 | | | 40 |
| 41 | 41 | 41 | | | 41 |
| 42 | 42 | 42 | | | |
| 43 | 43 | 43 | | | |
| 44 | 44 | 44 | | | |
| 45 | 45 | 45 | 45 | 45 | 45 |
| 46 | 46 | 46 | 46 | 46 | 46 |
| 47 | 47 | 47 | | | |
| 48 | 48 | | | | |
| 49 | 49 | 49 | | | 49 |
| 50 | 50 | 50 | | | |

Custom Cooking Recipes
Tables 1 & 2 are repeated again for convenience.

TABLE 1

| Column B |
|---|
| _a |
| 100 |
| 100 |
| c_200 |
| 200_b |
| d_200 |

TABLE 2

| Column A |
| --- |
| _a |
| 100 |
| 200 |
| c_400 |
| 600_b |
| d_800 |

Different cooking "recipes," custom cooking, are possible for a given edge in order to improve accuracy. Tables 1 & 2 for this example illustrate cooking about to occur on edge d. Whether or not cooking is performed on edge d, cooking on edge d cannot contribute to the mathematical rounding decision about to be made on edge d; cooking does not help the current rounding decision.

But, edge d becomes edge b in the very next cycle (the next line of the spreadsheet, as described above), and in the cycle after said very next cycle, what was originally edge d becomes edge c, and some number of cycles after becoming edge c, what was originally edge d becomes edge a.

As described in the example illustrated by Tables 1 & 2, edge d gets used three times after a rounding decision (with or without cooking) has been made for it, and each time this edge d is subsequently used, it is used in a different capacity. Below are ways to, in effect, cook a given edge differently to improve accuracy depending on the capacity the given edge is serving, that is, depending on the particular use the given edge is currently involved in.

For example, below is a method of improving the accuracy of the calculation for the local average, Z, by improving the accuracy of the reference distance (column C' or C" etc. in the spreadsheet) used for the calculation of the local average, Z. The approach essentially takes advantage of a tighter (lower) cooking threshold but only for the two edges defining the reference distance to be used in calculating the local average, Z.

Before figuring the local average for the next line in the spreadsheet, for example, a numerator representing the reference distance must be calculated for the current line; this current numerator is the sum of timing counts of all elements separating the two reference distance edges being used to establish Z (and the denominator is the total number of modules in these elements).

Referring to spreadsheet operation for example, the current numerator may be calculated, for example, by subtracting the value in column A for the top reference edge from the value in column A for the bottom line reference edge to get the distance in ticks separating these two reference edges. The accuracy improvement to the numerator is made prior to the next local average calculation: the numerator is adjusted once for the top line and adjusted again for the bottom line. For the top edge's line and the bottom edge's line, process the fractional portion from the respective line's column E value (after cooking, if used) as follows:

I. Top line reference distance calculation (edge a in Tables 1 & 2):
 A. If the E fraction on the top line is between 0.00 and 0.49 (if cooking is used at + or −0.20X threshold, this fraction will not be greater than 0.20), drop the integer portion of E and multiply the remaining E fraction times the current local and add the resulting product to the current numerator prior to the local calculation for the next line.
 B. If the E fraction on the top line is between 0.50 and 0.99, (if cooking is used at + or −0.20X threshold, this fraction will not be less than 0.80), drop the integer portion of E, subtract the remaining E fraction from one (1.00) and multiply that result times the current local and subtract the resulting product from the current numerator prior to the local calculation for the next line.

II. Bottom line reference distance calculation (edge b in Tables 1 & 2):
 A. If the E fraction on the bottom line is between 0.00 and 0.49 (if cooking is used at + or −0.20X threshold, this fraction will not greater than 0.20), drop the integer portion of E and multiply the remaining E fraction times the current local and subtract the resulting product from the current numerator prior to the local calculation for the next line.
 B. If the E fraction on the bottom line is between 0.50 and 0.99, (if cooking is used at + or −0.20X threshold, this fraction will not be less than 0.80), drop the integer portion of E, subtract the remaining E fraction from one (1.00) and multiply that result times the current local and add the resulting product to the current numerator prior to the local calculation for the next line.

In a fashion similar to each of the two reference edges, the top edge (only) of the sample distance may be adjusted separately, custom cooked. The accuracy improvement to the sample distance is made prior to the calculation of column E' for a given line (column C/column D=E'). The sample distance is adjusted for the top line of the sample only. For the top sample edge, process the fractional portion from the spreadsheet line's column E value (after cooking, if used) as follows:

III. Top line calculation of the sample distance (edge c in Tables 1 & 2):
 A. If the E fraction on the top line of the sample is between 0.00 and 0.49 (if cooking is used at + or −0.20X threshold, this fraction will not be greater than 0.20), drop the integer portion of E and multiply the remaining E fraction times the current local and add the resulting product to the sample distance prior to the calculation for E'.
 B. If the E fraction on the top line of the sample is between 0.50 and 0.99, (if cooking is used at + or −0.20X threshold, this fraction will not be less than 0.80), drop the integer portion of E, subtract the remaining E fraction from one (1.00) and multiply that result times the current local and subtract the resulting product from the sample distance prior to the calculation for E'.

More Edges Are Better Than Two to Figure Z

In other bar code decoders including certain embodiments of applicants' decoder described above, two edges are used to establish the local average, Z (shown in column D on the spreadsheets). These decoders therefore may be called two-edge based Z approaches. Applicants also disclose more powerful multi-edge based approaches which are preferred for some bar code applications and devices because of the following:

Based on their opinion that all edges in a bar code symbol are perceived within a similar range of accuracy with an occasional "flier" edge further off-target than most other edges (spikes), why are only two edges used to establish Z? since, between those two edges, there are other edges and each is able to contribute at least something toward Z's accuracy.

The Six Edge Approach to Figure Z

In their efforts to find ways to get an accurate Z (column D in the spreadsheets) with which to measure a sample, applicants' found the "six edge approach." The six edge approach is not limited to six edges or any other number of edges. Six edges is the number of edges used to disclose, by way of example, applicants' new approach to establishing a Z with which to measure.

The six edge approach may be applied repeatedly to establish an operative Z on each line of the spreadsheet, for example, each time another edge is encountered. In this manner, a sequence of reference distances is established with which to measure.

More edges than six, for example, lend more accuracy up to the point where acceleration interferes, and, there is diminishing need for more edges which are not for free; without acceleration concerns, a tradeoff for more edges is the time and facilities associated with more processing.

Figure 4:
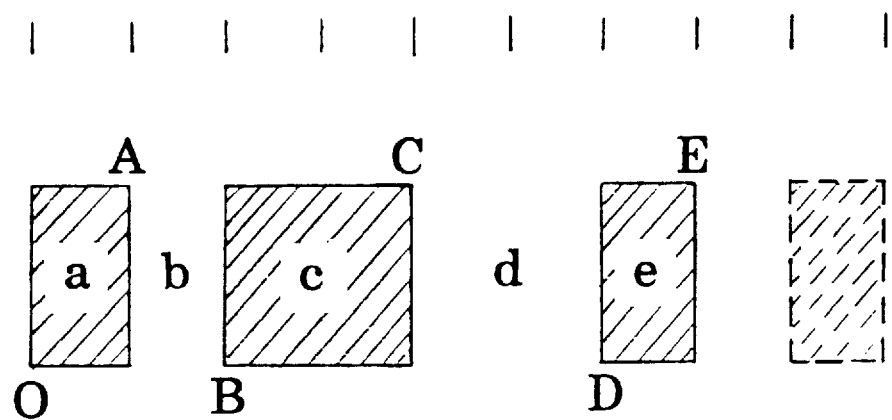
FIG. 4 represents the six edge approach to establishing Z, the local average, by which to measure.

Six consecutive bar code edges, O, A, B, C, D and E, encompass five elements, a, b, c, d and e, as shown in the BCB example depicted in FIG. 4. The module length of the five elements, a, b, c, d and e, are 1, 1, 2, 2 and 1, respectively. Edges O, B and D are leading edges and A, C and E are trailing edges. Similar edges are paired with all other similar edges, and each such pair of edges is used to calculate a respective Z (prior discussion focused on pair(s) of elements). These similar edge pairs are not all equal to each other in extent, some may have fewer modules than others.

The leading edges O, B and D pair into OB, OD and BD, and trailing edges A, C and E pair into AC, AE and CE. These six edges produce these six pairs which produce six respective Zes (as used herein, "Zes" is the plural form of Z). In the BCB example show in FIG. 4, the following six formula may be used to calculate the respective Zes, $Z_1$, $Z_2$, $Z_3$, $Z_4$, $Z_5$ and $Z_6$, for the six pairs. The denominator is the number of modules separating the respective two edges used in each formula:

$(B-O)/2=Z_1$ $(C-A)/3=Z_4$ $(D-O)/6=Z_2$ $(E-A)/6=Z_5$ $(D-B)/4=Z_3$ $(E-C)/3=Z_6$

If no fliers were present, an average, the arithmetic mean of the six Zes, might suffice to produce the reference Z which will be used to measure samples. If one flier were present, however, that one flier would tend to corrupt the mean, but this can be avoided. If the median Z of the six Zes were selected instead of the arithmetic mean, one flier could not corrupt the median Z, because one flier can corrupt at most two of the six formulae's Zes (each edge is used only in two formulae), and the median would likely be the arithmetic mean of two of the other four Zes. The median approach, therefore, is another improvement to establish a Z with which to measure.

Notwithstanding other comments, applicants believe that if noise is the only thing to cope with (no fliers present), the mean may be preferred to establish the local, Z, but if fliers are present, the median may be preferred over the mean to establish the local, Z, because fliers tend to weight a mean too much.

If six Zes were to be selected from for the selection of an operational local, Z, with which to measure a sample distance, such as shown in the independent median approach illustrated in FIG. 7 (described below), a compromise approach perhaps, is to use, for example, the arithmetic mean taken from the middle four Zes. It would be useful to know more about the distribution and amplitude of noise and of fliers to sort out details further.

Applicants understand the median of an odd number of choices to be the middle choice, and the median of an even number of choices to be the arithmetic mean of the two middle choices, but perhaps this goes without saying.

Applicants also understand that there are only two ways or "directions" for a Z to be corrupted, there are two kinds of bad Zes: Z can be too large or Z can be too small. If a Z is not accurate or correct, it must be too large or too small. Two Zes may be related through one edge because two Zes may have one edge in common. Because of a flier edge, for example, a bad Z that is too large may offset another related-through-a-flier-edge bad Z which is too small. Or, two bad Zes related-through-a-flier-edge may both be too large or both too small because of the flier edge, as described below.

The formulae may also be represented as follows:

$0.500(B-O)=Z_1$ $0.333(C-A)=Z_4$ $0.167(D-O)=Z_2$ $0.167(E-A)=Z_5$ $0.250(D-B)=Z_3$ $0.333(E-C)=Z_6$

As may be seen, the coefficients used in the formulae are derived from the module lengths of the five elements (the coefficients are reciprocals). For operation purposes, in the spreadsheet program, for example, modules lengths of individual elements are found in column G, and (original) individual edge locations in ticks are found in column A' (in column A after correction).

As each new edge is encountered for processing in the spreadsheet, it could be paired with a similar edge and used to calculate Z twice for the six-edge approach discussed above, once for the similar edge directly above it and once more for the next similar edge directly above that (the two edges of this second pair of similar edges are separated by a greater extent than the first; the extent of the first pair is contained within the second's extent) so that each new edge is paired with the two preceding similar edges and Z is calculated for each pair.

Two more columns, D' and D", could be used to store one each of the two Zes calculated for each new line, column D' for the directly above pair of edges' Z with the lesser extent and column D" for the second pair of edges' Z with the greater extent. The three Zes calculated in turn from the three similar formulae and stored as described are then found in columns D' and D" from the current line and column D' from line directly above the previous line (the previous line is a dissimilar edge) and may be consulted as required for the Z selection process.

In the six edge approach example being described, there is a Z selection "pool" of six Zes from which a operational median Z with which to measure is figured and established. The six Zes for a given pool in this example are found in four consecutive lines of the spreadsheet, the first and the third of these lines having similar edges, e.g., leading edges, and the second and fourth therefore having trailing edges. For example, a given pool of six Zes may be found in a spreadsheet's current line's columns D' and D", the previous above line's columns D' and D", and column D' from the two previous lines above them.

The accuracy of the six formulae is not uniformly equal because of differences in module lengths. Each formula uses two edges. The more modules that separate the two edges used in each formula, the more accurate. This is because a formula with more modules separating its two edges reduces whatever edge errors happen to exist on its two edges more than does a formula with fewer modules. This reduction is a function of the number of modules.

In one embodiment, the disparity in accuracy among the six formulae may be compensated beyond just the use of the median Z selection process just described. For example, in preparing for the Z selection process, use each Z more than once to "weight" it as follows: enter each Z into the Z selection pool as many times as the number of modules that separate the two edges used in its respective formula:

According to the example in FIG. 4, $Z_1$ would be entered twice since its formula has 2 modules (separating its two edges), $Z_2$ would be entered six times since its formula has 6 modules, $Z_3$ would be entered four times since its formula has 4 modules, $Z_4$ would be entered three times since its formula has 3 modules, $Z_5$ would be entered six times since its formula has 6 modules and $Z_6$ would be entered three times since its formula has 3 modules. A median would then be selected from the total, 2+6+4+3+6+3, of 24 Z entries.

The formulae may also be modified and used in other ways. For example, these six formulae are modified from the above formulae:

$$1.50(B-O)=3Z_1 \quad 1.00(C-A)=3Z_4$$

$$0.50(D-O)=3Z_2 \quad 0.50(E-A)=3Z_5$$

$$0.75(D-B)=3Z_3 \quad 1.00(E-C)=3Z_6$$

If these six formulae were used, the median might be selected from the six 3Z results, and that selection may then be divided by 3 to get Z.

Be that as it may, if there were one flier edge among the six edges in the six edge approach, and it was located in the middle of its three similar edge set, it corrupts two Zes, but they would tend to offset each other during the Z selection pool because one would be too large and the other would be too small and therefore neither of these two corrupted Zes is likely to influence the median Z.

If the flier edge is one of the outside edges of its three similar edge set, it corrupts two Zes and they do not tend to offset each other in the Z selection process, because both bad Zes are too large or both bad Zes are too small, but neither of these corrupted Zes is likely to influence the median Z either: Since only one flier exists, the other four Zes stand a better chance of being selected for averaging into the median, notwithstanding what disparity there is in the accuracy of the six formulae's results described above.

However, because of this offset and non-offset result, applicants suggest that only these two of the six formulae may used to establish the operative Z (and the other four are not used at all):

$$0.167(D-O)=Z_1$$

$$0.167(E-A)=Z_2$$

These two formulae are selected because the two edges in each enjoy greater separation than the respective two edges in the other four formulae. In this approach, each of the two edges is used only once (discussed below). The operative Z may be found by taking the arithmetic mean of the two resulting Zes.

Rather than taking the arithmetic mean average of these two resulting Zes, applicants weight the two resulting Zes from these two formulae to establish an operative Z with which to measure as follows for some bar code applications and devices: Referring to the example in FIG. 4, add the timing counts separating edges D and O to the timing counts separating edges E and A and then divide the sum of these ticks by the sum of the number of modules separating edges D and O, 6 modules, and the number of modules separating edges E and A, 6 modules (in this particular example, weighting would not change anything because both sets of reference edges, edges D and O, and edges E and A, are separated by the same number of modules):

[(ticks between D and O)+(ticks between E and A)]/12 modules

This approach is particularly viable as described because each reference edge is used only once. In this example, the timing counts separating only two sets of reference edges were summed. However, the timing counts separating more than two sets of reference edges may be summed. The denominator would be the sum of modules between all sets of reference edges contributing to the timing count sum.

Not that it has been suggested, but a median selected from only three Zes which have been derived from three similar edges as described above to establish a Z with which to measure would not be good for this decode operation, because one flier edge of a similar three edge set could corrupt two Zes, and one of the two corrupted Zes may become the operative median. However, for similar reasons, if six different similar edges are all used to make three Zes, two for each Z, and a median is selected from these three Zes, one corrupted Z due to one flier edge would be avoided (this approach is discussed below).

If one additional bar element were added to the example depicted in FIG. 4, that one bar would introduce one more leading edge and one more trailing edge into the no-longer six, now-eight edge approach. If one flier existed in the first six edges, and an additional bar element did not introduce another flier, the new element adds one (arithmetically) to the population of Zes-corrupted-by-the-one-flier, but, the additional bar element increases the total population of Zes exponentially, from a total of six Zes for six edges to twelve Zes for eight edges. Six edges produces six Zes while eight edges produces twelve Zes: if there were eight edges, O, A, B, C, D, E, F and G, leading edges O, B, D and F would pair into OB, OD, OF, BD, BF and DF, and trailing edges A, C, E and G would pair into AC, AE, AG, CE, CG and EG. These eight edges thus produce twelve pairs which would produce twelve respective Zes.

If an added bar element does not add another flier, the added bar element provides the Z selection process with increased safety margin from the corruption of one flier. A flier on each of two similar edges of six total edges may affect three of the six Zes, while a flier on each of two dissimilar edges of the six edges affects four of the six Zes. A flier on each of two similar edges of eight total edges may affect five of the twelve Zes, while a flier on each of two dissimilar edges of eight edges affects six of the twelve Zes.

In one embodiment, applicants prefer the six edge approach for start up. If a particular bar code pattern (e.g., an end pattern) had a sufficient number (e.g., five) of fixed edges available to establish the first operative Z to start up the processing, the six edge approach is most suitable.

The usefulness of the six edge approach has limits: In the first instance, if the module length of a sufficient number of elements in a given pattern are unknown, the six edge approach cannot be applied. (For example, the six edge approach would not be good to start up processing of Interleaved 2 of 5, not enough fixed edges, although if applicants' decoder were being used, the six edge approach could be used after start up of I 2 of 5.) However, after decoding the elements of the given pattern into known module lengths, i.e., in the second instance, the six edge approach may be used to establish Z (again, after the first decoding) for that given pattern, minimally for possible error detecting.

Because of applicants' described directional decoder approach that separates pairs of elements into individual elements of (decoded) known module lengths, the possible usefulness of the six edge approach for use therewith is less limited: after the start up, however that is done (with the six edge approach, see next paragraph, or without the six edge approach), the six edge approach can be used in the first instance to establish Z repeatedly, over and over, for decoding purposes throughout the decoding operation right to the end of the symbol as described above.

The six edge approach can work with more than six edges as well as with fewer: for example, to start up processing of a BCB symbol from the stop pattern need if the edge bordering the quiet zone is unreliable because of "bloom" effect, only five fixed edges are available; the six edge approach works well reduced down to five edges (only four Zes are calculated from the five fixed edges, three trailing edges and two leading edges, for the Z selection pool) using one embodiment of the six edge approach.

Figure 5:
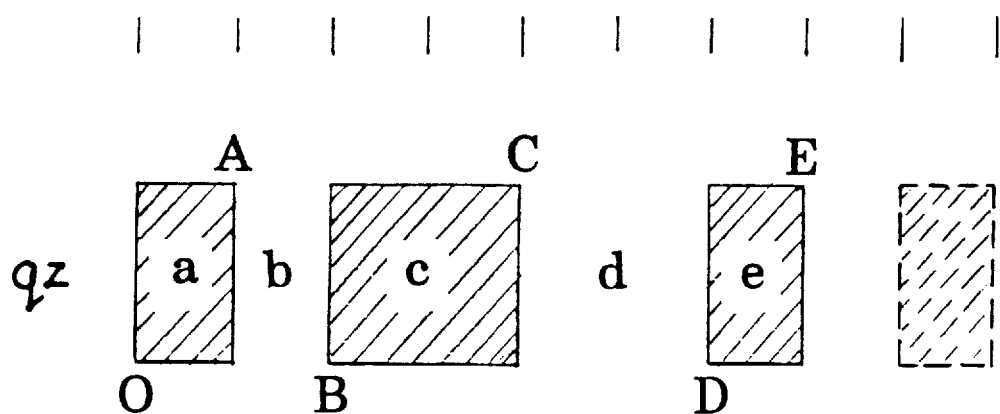
FIG. 5 shows five edges to establish Z, the local average, by which to measure.

Applicants also describe the following by way of example. To start up processing with a BCB symbol from the stop pattern end, for example, if the edge bordering the quiet zone is unreliable: Five consecutive bar code edges, A, B, C, D and E, encompass four elements, b, c, d and e, as shown in this BCB example depicted in FIG. 5. The module length of the five elements, b, c, d and e, are 1, 2, 2 and 1, respectively. Edges B and D are leading edges and A, C and E are trailing edges.

Two pair of reference edges are used, the leading edges B and D pair into BD, and trailing edges A and E pair into AE (AE is used because it is separated by more modules than other possible trailing edge pairs). These two pairs of reference edges are weighted by repetition as follows because A to E is 6 modules and B to D is 4 modules (the ratio of A to E: B to D is 3:2). The numerator is the timing count sum of the reference distances between the (repeated) pairs of edges shown, and the denominator is the sum of the modules separating these 5 (total) pairs of edges (6+6+6+4+4=26):

AE+AE+AE+BD+BD/26

The Independent Median Approach to Figure Z

More edges are better than only two to establish a Z with which to measure, that seems clear to applicants, but the six edge approach as described is not their only useful multi-edge based approach. If more elements (say, e.g., eight edges) may be used before acceleration interferes to establish Z after the processing has been started, for example, other multi-edge based approaches might be preferred for some bar code applications and devices because, in applicants independent median approach about to be described, more than two edges are used to calculate more than one Z in order to select an operative median Z, but each edge is used in figuring no more than one Z.

Referring to FIG. 6, eight total edges are used, and the extent of the reference distance for each of the four illustrated Zes, $Z_1$, $Z_2$, $Z_3$ and $Z_4$, is four elements. Each of the two edges used to figure each Z is separated three in-between edges. Each of the two edges used to figure each Z is independent, each is used once in only one Z calculation. For reasons mentioned below, fewer than four Zes, for example, only three, $Z_1$, $Z_2$ and $Z_3$, may comprise the Z selection pool from which an operative median Z is selected (in which case, only seven total edges would be used). But, for example in FIG. 6 where eight total edges are shown, it may be best to use no more than the four Zes as illustrated.

If another Z, $Z_5$ (not illustrated), were added to the left of $Z_4$ in a similar manner in FIG. 6, $Z_5$'s bottom edge would be the same edge as $Z_1$'s top edge, and therefore $Z_5$ may tend to offset the value of $Z_1$. For example, if a bad edge common to $Z_1$ (top edge) and the added $Z_5$ (bottom edge) had been hit with a flier that caused $Z_1$ to be calculated too large, that same bad edge would cause $Z_5$ to be calculated too small by that amount (of course, the net result for each Z also depends on each other respective edge as well).

Thus, if only three edges separate the edges for each Z as shown in FIG. 6, additional Zes beyond that first four Zes as described seem, at a minimum, less productive than first four Zes.

The independent median approach described in association with in FIG. 6 for example, may be implemented as follows: One more column, D' (note to be confused with the column D' mentioned earlier in relation to a different example), could be added to the spreadsheets to contain the operative median Z. Z for column D may be calculated as described above based on two pair of elements (four elements). But column D would not contain the operative median Z, column D would contain the Z selection pool from which the operative median Z with which to measure is established, and the operative median Z would be saved in column D'.

Assume a Z selection pool of (only) three Zes ($Z_1$, $Z_2$ and $Z_3$) with the set up illustrated in FIG. 6 is desired in a particular decoding application. In order to measure a sample pair of elements on a given line of the spreadsheet, for example, the median of the three prior Zes would be selected as the operative median Z, and this selected median Z for the given line could be put into column D' as described for this given line for operational purposes.

FIG. 7 illustrates the independent median approach based on twelve total edges; the extent of the reference distance for each of the six illustrated Zes is six elements (versus four elements in FIG. 6). Each of the two edges used to figure each Z is independent, used once in only one Z calculation. With six elements separating each reference distance, six is the most Zes that can be used in the Z selection pool before using an edge more than once as described for FIG. 6.

Applicants prefer their independent median approach after processing has been started. Up to the point where acceleration interferes, and assuming processing power is not an issue, applicants prefer the embodiment of their independent median approach depicted in FIG. 7 over FIG. 6 because of the advantage there is in using a larger reference extent, six elements versus four elements, respectively. If acceleration does begin to interfere a little, perhaps the FIG. 7 embodiment should be used with a smaller Z selection pool, for example, a pool of three, four or five Zes (5 Zes=$Z_1$, ($Z_2$, ($Z_3$, $Z_4$ and $Z_5$) only (and not $Z_6$).

One difference between using five Zes versus three Zes is that two fliers creating either two too-large Zes or two too-small Zes can corrupt two Zes of five and still not influence the selected median Z, while two fliers creating either two too-large Zes of two too-small Zes of three (only) Zes, one of these two bad Zes may become the selected median Z.

If acceleration does begin to interfere more than a little, the FIG. 6 embodiment with a Z selection pool of three Zes may produce better results than FIG. 7 even if FIG. 7 has fewer Zes in the pool than the six possible.

If acceleration is sufficiently low, applicants may prefer even more than the six elements depicted in FIG. 7 be used to establish the respective Zes in some bar code applications and devices. For example, the independent median approach may be based on fourteen total edges where the extent of the reference distance for each of the eight possible Zes in the Z selection pool is eight elements (versus six for FIG. 7). Depending on the nature of the distribution of noise and spike edge errors, only three or perhaps only five of the eight possible Zes may suffice for the pool (as may also be the case for, for example, FIG. 7).

Referring again to FIG. 7, another approach for figuring an operational Z is described by way of review. The extent of the reference distance for each of the six illustrated Zes in FIG. 7 is six elements. For simplicity of explanation, assume each bar and space element shown in FIG. 7 is one module wide. Each reference distance therefore is 6 modules.

First, sum the timing counts for all six reference distances (instead of calculating a respective Z for each reference distance). Then divide this timing count sum by the module sum of the six reference distances (6 references distances×6 modules=36 modules). The quotient may be used as the operational Z with which to measure a sample.

As is understood, these approaches may be repeated for a sequence of edges contained within a bar code symbol representing characters.

No matter how and no matter how many edges contribute something toward Z's accuracy as described above, when processing in the reverse direction as also described above, a given sample pair of edges will not encounter the same operational Z figured from the same edges as it encountered when processed in the first direction. Reverse processing works even when more exotic methods, systems and devices are used to figure Z.

Above are several examples of how different processing steps may be used to establish the local average in a different manner. Various different processing steps may be used in order obtain another result from processing the same scan data another time, for example, to confirm a good reading. This is an example of possible software voting. Or, this may be helpful to, for example, salvage a good read from a no-read.

BCB Identification Logic

Figure 8A:
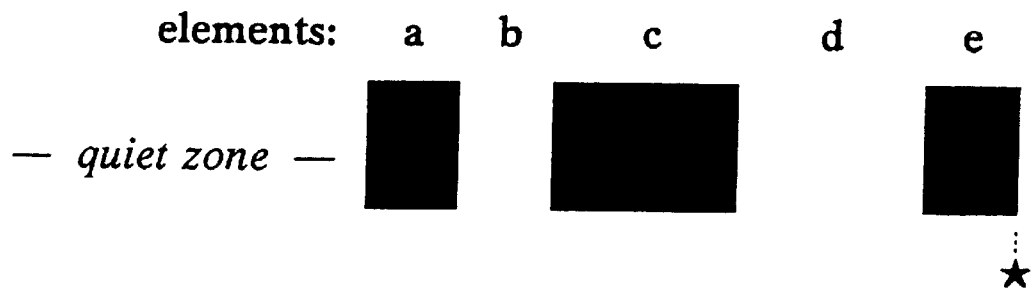
FIGS. 8A and 8B represent respectively a BCB stop pattern and a BCB start pattern.
Figure 8B:
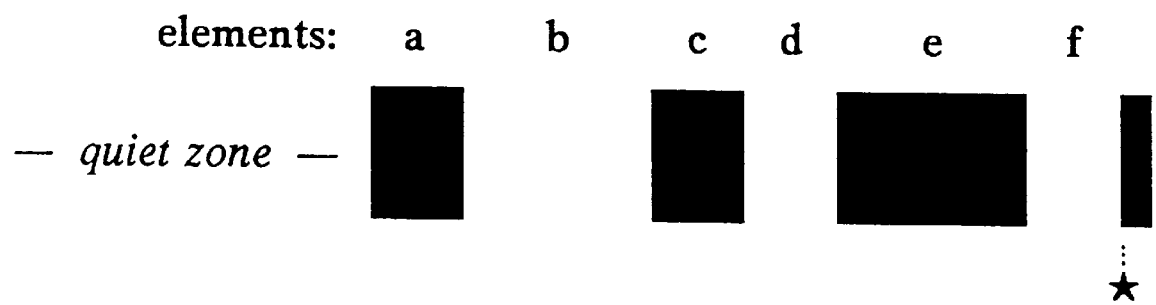

In fixed-mounted bar code scanners like AccuSort's model 20 and 30, processing the return signal of a bar code scan starts after leading and trailing quiet zones have been detected bracketing a suitable number of apparent bar code elements. A scan of BCB is identified in an auto-discriminating environment that may include popular bar codes by using both BCB ending patterns. Referring to FIGS. 8A and 8B, these "greater than" (>) logic questions will answer "yes" to a BCB stop pattern: Is d>b? c>e? and c>a? and these questions answer yes to a BCB start pattern: Is b>d? b>f? e>c? and e>a?

After a BCB symbol has been identified and oriented, processing preferably begins using the end pattern scanned last so that the edges of the outermost black element of end pattern scanned last (its bloom bar) can be utilized to start up processing without fear of bloom distortion (since it was scanned last, no bloom; bloom bar distortion typically causes the first black element after a quiet zone to be perceived too wide). If the bloom effect in a given scanner is too large, the logic questions including the bloom bar (element a in FIGS. 8A and 8B) may be less useful for identification purposes.

Before BCB's individual edge processing is started with the end pattern scanned last, steps may be taken to avoid processing the edges of the other end pattern; the other end pattern's edges should not be processed. For example: flag the edge in the other end pattern shown directly above the star in FIG. 8 so that this edge with the star is the last edge processed; or, delete or store separately all edges of the other end pattern between the edge with the star and the quiet zone so that individual edge processing stops after the edge with the star has been processed; or, use a count of the number of edges (or elements) between quiet zones to keep track of when to stop BCB's edge processing.

Computer System

Figure 9:
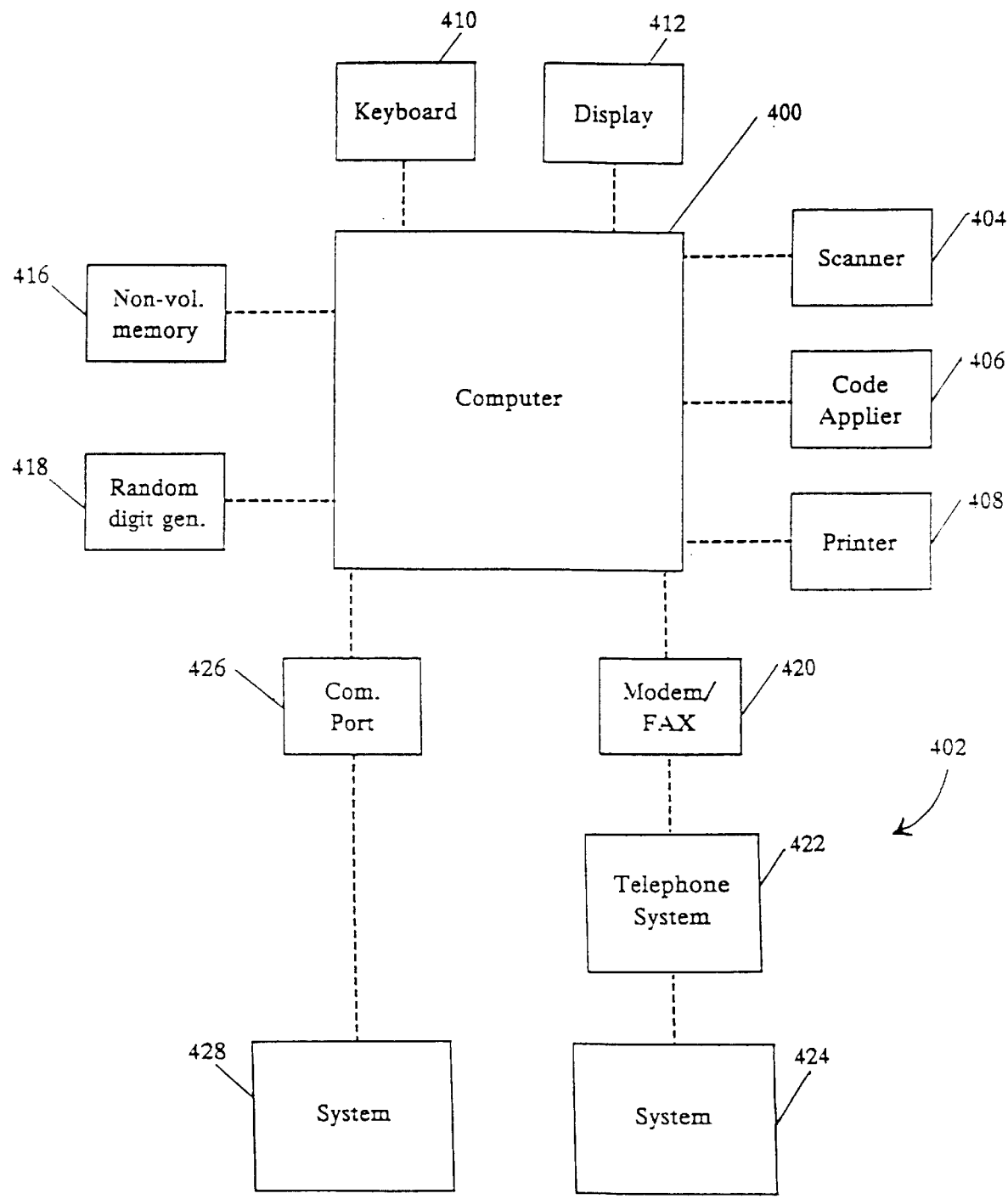
FIG. 9 is a block diagram of a system including a computer for carrying out the functions described in the application.

FIG. 9 depicts a computer 400 which may be used in a computer system 402 to carry out the processing, storing, bar code and machine reading, signal encoding and decoding, bar code printing, communicating with remote systems and terminals, etc. Computer 400 comprises conventional components known to those of skill in the art, and may be a microcomputer, personal computer, etc. As such, computer 400 includes a central processing unit (CPU), read only memory (ROM), random access memory (RAM), input/output interfacing and control, registers, etc.

The following may be connected to computer 400 in various combinations to form a variety of computer systems 402, the connections being represented by broken lines which are meant to indicate that different components may be connected as necessary to achieve a given function: a scanner device 404 for machine reading bar codes or other machine-readable information, e.g., a hand-held bar code reader of the type described in "PC Magazine," Vol 7, No. 12, Jun. 29, 1988, starting at page 213; a code applier device 406 for applying code elements to paper, objects, etc., e.g., a laser or other printer for printing bar codes on paper or on other objects or, e.g., a computer controlled machinist's cutting tool to make recesses or slants on objects such as parts, tokens or casino chips, molds or dies etc; an impact, ink jet or laser printer, or a plotter 408 for printing text and graphics; a keyboard 410; a display 412; non-volatile read/write, or write once read memory (WORM) storage device 416, of the magnetic, optical, etc. type, e.g., magnetic floppy or hard disc drive (in which, e.g., sub-piles may be stored); a random digit generator 418 which may, e.g., generate digits based on random cosmic noise); a modem or FAX 420 for communicating via telephone system 422 with other systems or terminals, etc., 424; a communications port 426, e.g., an RS232 port, for outputting coded signals to and receiving coded signals from other systems, terminals, etc. 428. Systems 424 and 428 may include a computer and components as described above for system 402.

Software and programs for operating computer 400 and computer system 402 to carry out the functions described herein are available or known or can be constructed by those of skill in the art from the disclosure herein.

Appendix C, Decoder Program, BCB Module Conversion Procedure, provides instruction in high level language to program a BCB bar code decoder system according to many features and error correcting systems described above.

Filed herewith is a copy of a document applicants received shortly before filing this patent application, "Quality Specification for the U.P.C. Printed Symbol" published by The Uniform Code Council, Incorporated, 8163 Old Yankee Road, Dayton, Ohio 45458. It includes section 3.5.5., which includes a complete U.P.C. Reference Decode Algorithm. The decoder system that is described in section 3.5.5 works as described by Savir et al. referred to in detail above. However, section 3.5.5. is more complete in some ways.

Modifications And Other Embodiments

Certain changes and modifications of the embodiments of the invention disclosed herein will be readily apparent to those skilled in the arts. Moreover, to those in the various arts, the invention itself herein, will suggest solutions, etc., to other tasks, etc. Additionally, information coded and/or decoded with the coding/decoding system disclosed herein will find operating environments in various machinery such as mechanical, pneumatic, hydraulic, electronic. It is also possible to utilize two or three dimensional coded formats in accordance with the invention. Although optical coding has been described in connection with a number of embodiments, it is to be understood that other forms of coding may be used, and that in such other forms of coding, "black" and "white" refer to the logic levels of which the coding form is comprised. Also, the code elements may have shapes other than those described herein. It is the applicants' intention to cover by the claims all such uses of the invention and all those changes and modifications which could be made to the embodiments of the invention herein chosen for the purpose of disclosure without departing from the spirit and scope of the invention. In the claims, terms such as obtain(ing), storing, processing, etc., information from coded objects, signals, coded information, etc., apply not only to information itself but to information related thereto or derived therefrom.

What is claimed is:

1. A computer system for distorting bar code timing count scan data for use in evaluating bar codes, comprising:

a computer programmed to distort edges of bar code timing count scan data to simulate at least one bar code edge distortion;

at least one of a memory and an input device coupled to or forming part of the computer by means of which bar code timing count scan data and at least one parameter for distorting the bar code timing count scan data are made available to or in the computer;

the computer being programmed to distort edges of the bar code timing count scan data to simulate at least one bar code edge distortion.

2. A computer system according to claim 1 wherein the computer is programmed to simulate a plurality of different bar code edge distortions including those representing ink spread and noise.

3. A computer system according to claim 1 including an output device coupled to the computer to display, print or store on a computer readable storage medium the bar code timing count scan data with the at least one simulated bar code edge distortion.

4. A computer system according to claim 1 wherein the computer is programmed to distort the edges of bar code timing count scan data in stages with acceleration distortion in selectable levels.

5. A computer system according to claim 1 wherein the computer is programmed to distort the edges of the bar code timing scan data in stages with ink spread.

6. A computer system according to claim 1 wherein the computer is programmed to distort the edges of the bar code timing scan data in selectable levels with noise.

7. A computer system according to claim 1 wherein the computer is programmed to evaluate the effect of the at least one simulated distortion on decoding of the bar code represented by the bar code timing count scan data into which the computer has introduced at least one distortion.

8. A computer system for providing distorted bar code timing count scan data for use in evaluating bar codes, comprising:

a computer programmed to distort edges of bar code timing count scan data to simulate at least one bar code edge distortion;

at least one of a memory and an input device coupled to or forming part of the computer by means of which bar code timing count scan data and at least one parameter for distorting the bar code timing count scan data made available to or in the computer; and a computer readable medium coupled to the computer on which can be recorded under control of the computer bar code timing count scan data distorted by the computer and from which the distorted timing count scan data recorded thereon can be obtained for use by another computer in evaluating a bar code.

9. A computer system according to claim 8 wherein the computer is programmed to simulate a plurality of different bar code edge distortions including those representing ink spread and noise.

10. A computer system according to claim 8 wherein the computer is programmed to distort the edges of bar code timing count scan data in stages with acceleration distortion in selectable levels.

11. A computer system according to claim 8 wherein the computer is programmed to distort the edges of the bar code timing scan data in stages with ink spread.

12. A computer system according to claim 8 wherein the computer is programmed to distort the edges of the bar code timing scan data in selectable levels with noise.

13. A computer system according to claim 8 wherein the computer is programmed to evaluate the effect of the at least one simulated distortion on decoding of the bar code represented by the bar code timing count scan data into which the computer has introduced at least one distortion.

14. A method for providing bar code timing count scan data with at least one simulated distortion therein, comprising:

providing a computer program which causes a computer to distort edges of bar code timing count scan data to simulate at least one bar code edge distortion; and operating the computer with the program to distort edges of bar code timing count scan data and provide bar code timing count scan data with at least one simulated bar code edge distortion.

15. The method according to claim 14 wherein the computer is operated to simulate a plurality of different bar code edge distortions including those representing ink spread and noise.

16. The method according to claim 14 wherein the computer is operated to distort the edges of bar code timing count scan data in accordance with at least one of the following:

in stages with acceleration distortion in selectable levels;

in stages with ink spread; and in selectable levels with noise.

17. The method according to claim 14 comprising the step of recording on a computer readable storage medium the bar code timing count scan data with the at least one simulated bar code edge distortion.

18. The method according to claim 15 comprising the step of recording on a computer readable storage medium the bar code timing count scan data with the plurality of different bar code edge distortions including those representing ink spread and noise.

19. The method according to claim 16 comprising the step of recording on a computer readable storage medium the bar code timing count scan data with at least one of the following distortions:

in stages with acceleration distortion in selectable levels;

in stages with ink spread; and in selectable levels with noise.

20. A computer readable storage medium made in accordance with the method of claim 17.

21. A computer readable storage medium made in accordance with the method of claim 18.

22. A computer readable storage medium made in accordance with the method of claim 19.

* * * * *